(12) United States Patent
Lee

(10) Patent No.: US 10,141,066 B2
(45) Date of Patent: Nov. 27, 2018

(54) MEMORY DEVICE AND OPERATING METHOD THEREOF

(71) Applicant: SK hynix Inc., Gyeonggi-do (KR)

(72) Inventor: Hee Youl Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/466,070

(22) Filed: Mar. 22, 2017

(65) Prior Publication Data

US 2018/0025784 A1 Jan. 25, 2018

(30) Foreign Application Priority Data

Jul. 19, 2016 (KR) .................. 10-2016-0091475

(51) Int. Cl.
| | |
|---|---|
| *G11C 16/04* | (2006.01) |
| *G11C 16/34* | (2006.01) |
| *G06F 3/06* | (2006.01) |
| *G11C 16/10* | (2006.01) |
| *G11C 16/24* | (2006.01) |

(52) U.S. Cl.
CPC .......... *G11C 16/3459* (2013.01); *G06F 3/061* (2013.01); *G06F 3/0659* (2013.01); *G06F 3/0679* (2013.01); *G11C 16/0483* (2013.01); *G11C 16/10* (2013.01); *G11C 16/24* (2013.01)

(58) Field of Classification Search
CPC . G11C 16/0483; G11C 16/10; G11C 11/5628; G11C 16/12
See application file for complete search history.

(56) References Cited

U.S. PATENT DOCUMENTS

| | | | | |
|---|---|---|---|---|
| 8,681,551 | B2 * | 3/2014 | Maejima | G11O 5/02 365/185.11 |
| 9,899,098 | B1 * | 2/2018 | Kaneko | G11C 16/349 |
| 10,026,487 | B2 * | 7/2018 | Chen | G11C 16/3431 |
| 2002/0036936 | A1 * | 3/2002 | Park | G11C 8/08 365/200 |
| 2008/0037327 | A1 * | 2/2008 | Park | G11C 8/08 365/185.19 |
| 2008/0144378 | A1 * | 6/2008 | Park | G11C 16/0483 365/185.05 |
| 2008/0239812 | A1 * | 10/2008 | Abiko | G11C 11/5628 365/185.12 |
| 2009/0040833 | A1 * | 2/2009 | Shin | G11C 16/0483 365/185.19 |
| 2009/0135656 | A1 * | 5/2009 | Park | G11C 7/14 365/185.19 |

(Continued)

FOREIGN PATENT DOCUMENTS

| | | |
|---|---|---|
| KR | 1020110009503 | 1/2011 |
| KR | 1020150091665 | 8/2015 |

*Primary Examiner* — Tuan T Nguyen
(74) *Attorney, Agent, or Firm* — IP & T Group LLP

(57) ABSTRACT

A memory device including: a memory block including a plurality of cell strings; a peripheral circuit configured to set voltages for a program operation of selected memory cells in the cell strings, and program the selected memory cells by using the set voltages; and a control circuit configured to control the peripheral circuit so that the selected memory cells are programmed in response to a program command, and increase a channel voltage of non-selected cell strings including non-selected memory cells while the selected memory cells are programmed, and an operating method thereof.

10 Claims, 13 Drawing Sheets

(56) References Cited

U.S. PATENT DOCUMENTS

2013/0148430 A1* 6/2013 Shiino .................... G11C 16/10
    365/185.18
2015/0078080 A1* 3/2015 Lee ......................... G11C 11/56
    365/185.03

* cited by examiner

MEMORY DEVICE AND OPERATING METHOD THEREOF

CROSS-REFERENCE TO RELATED APPLICATION

The present application claims priority under 35 U.S.C. 119(a) to Korean patent application number 10-2016-0091475 filed on Jul. 19, 2016, which is incorporated herein by reference in its entirety.

BACKGROUND

1. Field

The present disclosure relates to a memory device and an operating method thereof, and more particularly, to a program operation of a three-dimensional memory device.

2. Description of the Related Art

A memory device is a storage device implemented by using a semiconductor, such as silicon (Si), germanium (Ge), gallium arsenide (GaAs), and an indium phosphide (InP). The memory device may generally be classified into a volatile memory device and a nonvolatile memory device.

The volatile memory device is a memory device in which stored data is lost when a power supply is interrupted. The volatile memory device may include a Static random access memory (RAM) (SRAM), a Dynamic RAM (DRAM), a Synchronous DRAM (SDRAM), and the like. The nonvolatile memory device is a memory device in which stored data is maintained even though a power supply is interrupted. The nonvolatile memory device may include a Read Only Memory (ROM), a Programmable ROM (PROM), an Electrically Programmable ROM (EPROM), an Electrically Erasable and Programmable ROM (EEPROM), a flash memory, a Phase-change RAM (PRAM), a Magnetic RAM (MRAM), a Resistive RAM (RRAM), a Ferroelectric RAM (FRAM), and the like. A flash memory may generally be divided into a NOR type and a NAND type.

Among them, a memory device formed of the flash memory may include a memory cell array, in which data is stored, a peripheral circuit configured to perform a program operation, a read operation, and an erase operation of the memory cell array, and a control circuit controlling the peripheral circuit in response to a command.

When a memory device is formed in a three-dimensional (3D) structure, a memory cell array may include a plurality of memory blocks formed in the 3D structure. The 3D memory blocks may include a plurality of vertical strings vertically formed on a substrate. The vertical strings may include a plurality of memory cells stacked on the substrate in a vertical direction.

SUMMARY

The present disclosure is directed to a memory device, which is capable of decreasing the deterioration of program disturb during a program operation of the memory device, and an operating method thereof.

An exemplary embodiment of the present disclosure provides a memory device, including: a memory block including a plurality of cell strings; a peripheral circuit configured to set voltages for a program operation of selected memory cells in the cell strings, and program the selected memory cells by using the set voltages; and a control circuit configured to control the peripheral circuit for programming the selected memory cells in response to a program command, and to increase a channel voltage of non-selected cell strings including non-selected memory cells while the selected memory cells are programmed.

Another exemplary embodiment of the present disclosure provides an operating method of a memory device, including: comparing a pre-set program operation condition with a set program operation condition; maintaining a channel voltage of non-selected cell strings with a set-up level when the program operation condition is lower than the pre-set program operation condition as a result of the comparison, and increasing the channel voltage when the program operation condition is equal to or higher than the pre-set program operation condition; and programming selected memory cells included in selected cell strings based on one of the maintained channel voltage and the increased channel voltage.

Yet another exemplary embodiment of the present disclosure provides an operating method of a memory device, including: increasing a voltage applied to channels of non-selected cell strings during a program operation according to an increase of at least one of a target voltage, a verify voltage, and the program time of the program operation, and programming selected memory cells based on the increased voltage.

According to the exemplary embodiments of the present disclosure, it is possible to decrease the deterioration of program disturb by adjusting voltages applied to cell strings during a program operation. Accordingly, it is possible to improve reliability of a memory device.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Hereinafter, embodiments according to the present disclosure will be described in detail with reference to the accompanying drawings. In the description below, it should be noted that only parts necessary for understanding operations according to various embodiments of the present disclosure will be described, and descriptions of other parts may be omitted so as to avoid unnecessarily obscuring the subject matter of the present disclosure. However, the present disclosure is not limited to the embodiments described herein, and may be implemented in various different forms. However, the embodiments described herein are provided so as to describe the present disclosure in detail so that those skilled in the art may easily carry out the technical spirit of the present disclosure.

Throughout this specification and the claims that follow, when it is described that an element is "coupled" to another element, the element may be "directly coupled" to the other element or "electrically coupled" to the other element through a third element. Throughout the specification and the claims, unless explicitly described to the contrary, the word "comprise" and variations such as "comprises" or "comprising" will be understood to imply the inclusion of stated elements but not the exclusion of any other elements.

Figure 1:
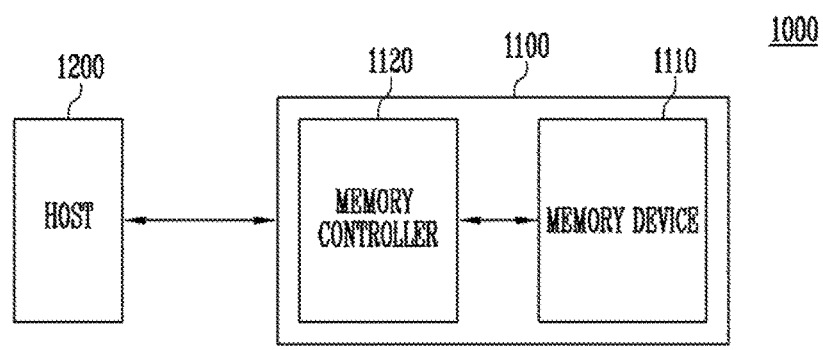
FIG. 1 is a block diagram illustrating a memory system according to an embodiment of the present disclosure.

FIG. 1 is a block diagram illustrating a memory system 1000 according to an embodiment of the present disclosure.

Referring to FIG. 1, the memory system 1000 may include a storage device 1100 and a host 1200 controlling the storage device 1100. The storage device 1100 may include a memory device 1110, in which data is stored, and a memory controller 1120 controlling the memory device 1110.

The host 1200 may communicate with the storage device 1100 by using an interface protocol, such as a Peripheral Component Interconnect-Express (PCI-E), an Advanced Technology Attachment (ATA), a Serial ATA (SATA), a Parallel ATA (PATA), a serial attached SCSI (SCSI), a Universal Serial Bus (USB), a Multi-Media Card (MMC), an Enhanced Small Disk Interface (ESDI), and an Integrated Drive Electronics (IDE).

The memory controller 1120 generally controls an operation of the storage device 1100, and controls data exchange between the host 1200 and the memory device 1110. For example, the memory controller 1120 may control the memory device 1110 so that a program, read, or erase operation is performed according to a request of the host 1200.

The memory device 1110 may include a Double Data Rate Synchronous Dynamic Random Access Memory (DDR SDRAM), a Low Power Double Data Rate4 (LPDDR4) SDRAM, a Graphics Double Data Rate (GDDR) SDRAM, a Low Power DDR (LPDDR), a Rambus Dynamic Random Access Memory (RDRAM), or a flash memory. In the present embodiment, the present disclosure will be described based on the memory device 1110 formed of a flash memory as an example.

Figure 2:
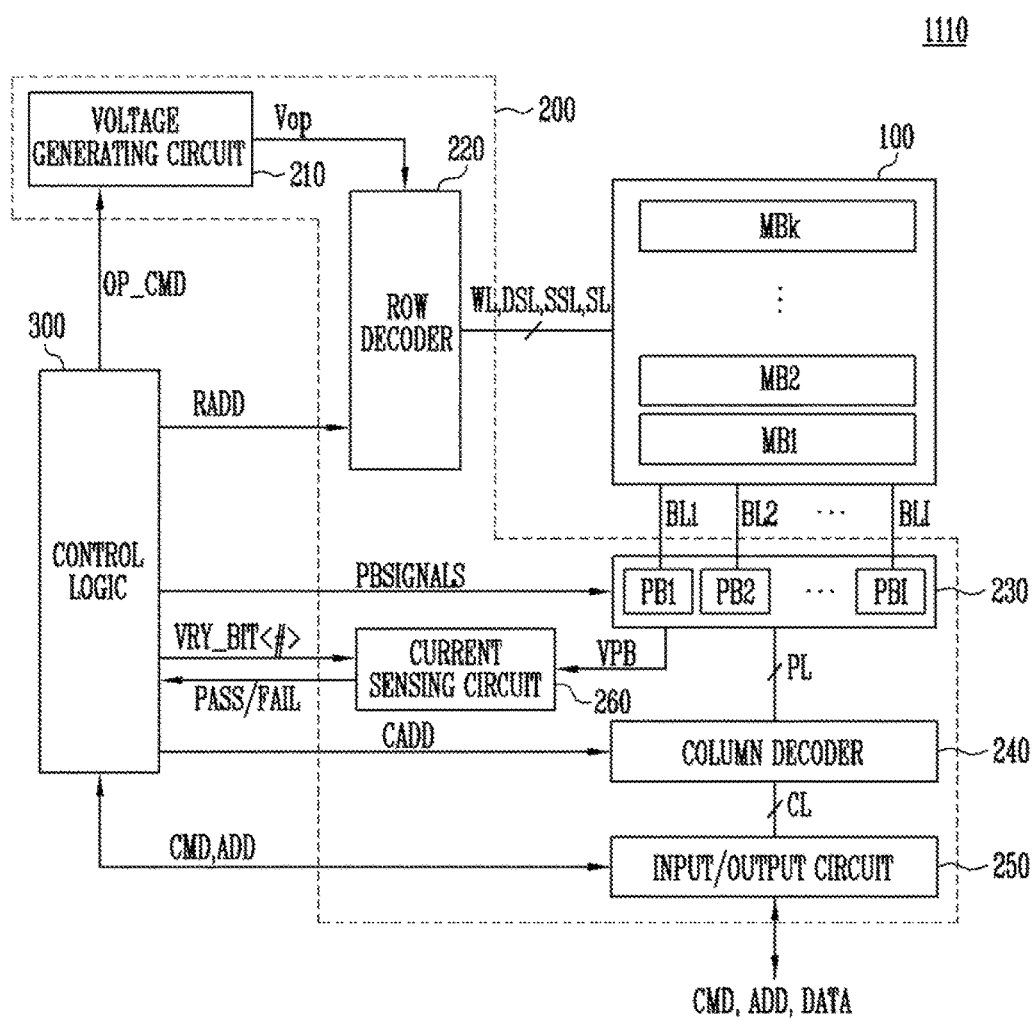
FIG. 2 is a diagram illustrating the memory device of FIG. 1.

FIG. 2 is a diagram illustrating the memory device 1110 of FIG. 1.

Referring to FIG. 2, the memory device 1110 may include a memory cell array 100, in which data is stored. The memory device 1110 may include a peripheral circuit 200 which is configured to perform a program operation for storing data, a read operation for outputting stored data, and an erase operation for erasing stored data. The memory device 1110 may include a control logic 300 controlling the peripheral circuit 200 according to the control of the memory controller 1120 (see FIG. 1).

The memory cell array 100 may include a plurality of memory blocks MB1 to MBk (where k is a positive integer). Each of the memory blocks MB1 to MBk may include a plurality of cell strings. The cell strings may be connected between a source line SL and bit lines BL1 to BLl (where l is a positive integer). The cell strings may include source select transistors, memory cells, and drain select transistors connected between the source line SL and the bit lines BL1 to BLl. Gates of the source select transistors may be connected to source select lines SSL, gates of the memory cells may be connected to word lines WL, and gates of the drain select transistors may be connected to drain select lines DSL.

The memory blocks MBL1 to MBLk may be formed in a two-dimensional (2D) or three-dimensional (3D) structure. When the memory blocks MB1 to MBk are formed in the 3D structure, pipe lines may be additionally connected to the memory blocks MB1 to MBk.

The peripheral circuit 200 may be configured to be capable of programming or erasing the memory cells included in a selected page under a control of the control logic 300. During the program operation, the peripheral circuit 200 may sequentially program the selected memory cells included in the selected page. For example, when the set page, in which the cell is selected, is selected according to program data received from an external device, the peripheral circuit 200 may perform a partial erase operation on the entirety or a part of the pages, on which the program operation is not performed, and then perform the program operation on the pages on which the partial erase operation is performed. To this end, the peripheral circuit 200 may include a voltage generating circuit 210, a row decoder 220, a page buffer unit 230, a column decoder 240, an input/output circuit 250, and a current sensing circuit 260.

Each of the peripheral circuit 200 will be described in detail below.

The voltage generating circuit 210 may generate various operation voltages Vop used in the program, read, or erase operation in response to an operation command OP_CMD. For example, the voltage generating circuit 210 may generate a source line voltage, a program voltage, a pass voltage, a precharge voltage, a source select line voltage, a drain select line voltage, a read voltage, and an erase voltage, and the like.

The row decoder 220 may transfer operation voltage Vop to the word lines WL, source select lines SSL, drain select lines DSL, and source line SL connected to the selected memory block in response to a row address RADD.

The page buffer unit 230 may include a plurality of page buffers PB1 to PBI connected to the respective bit lines BL1 to BLI. The page buffers PB1 to PBI may be operated in response to page buffer control signals PBSIGNALS. For example, the page buffers PB1 to PBI may temporarily store the program data received through the bit lines BL1 to BLI, or may sense voltages or currents of the bit lines BL1 to BLI during a read or verify operation. Further, the page buffers PB1 to PBI may adjust potentials of the bit lines BL1 to BLI according to the program data during the program operation. For example, the page buffers PB1 to PBI may ground the potentials of the bit lines BL1 to BUI to 0 V or precharge the potentials of the bit lines BL1 to BLI according to the program data. The page buffers PB1 to PBI may output a positive precharge voltage for precharging the bit lines BL1 to BLI.

The column decoder 240 may transfer data between the input/output circuit 250 and the page buffer unit 230 in response to a column address CADD. For example, the column decoder 240 may exchange data with the page buffers PB1 to PBI through the data lines DL, or exchange data with the input/output circuit 250 through column lines CL.

The input/output circuit 250 may transfer a command CMD and an address ADD received from the memory controller 1120 (see FIG. 1) to the control logic 300, or exchange data DATA with the column decoder 240.

The current sensing circuit 260 may generate a reference current in response to an allowable bit VRY_BIT<#>, compare a sensing voltage VPB received from the page buffer unit 230 with the reference current, and output a pass signal PASS or a fall signal FAIL during a read operation or a verify operation.

The control logic 300 may output an operation signal OP_CMD, the row address RADD, the page buffer control signals PBSIGNALS, and the allowable bit VRY_BIT<#> in response to the command CMD and the address ADD and control the peripheral circuit 200. Further, the control logic 300 may control voltages supplied to the selected memory block according to a target voltage, a verify voltage, or a program time during the program operation. For example, the control logic 300 may control a source line voltage, a program voltage, a pass voltage, a precharge voltage, a source select line voltage, and a drain select line voltage.

Figure 3:
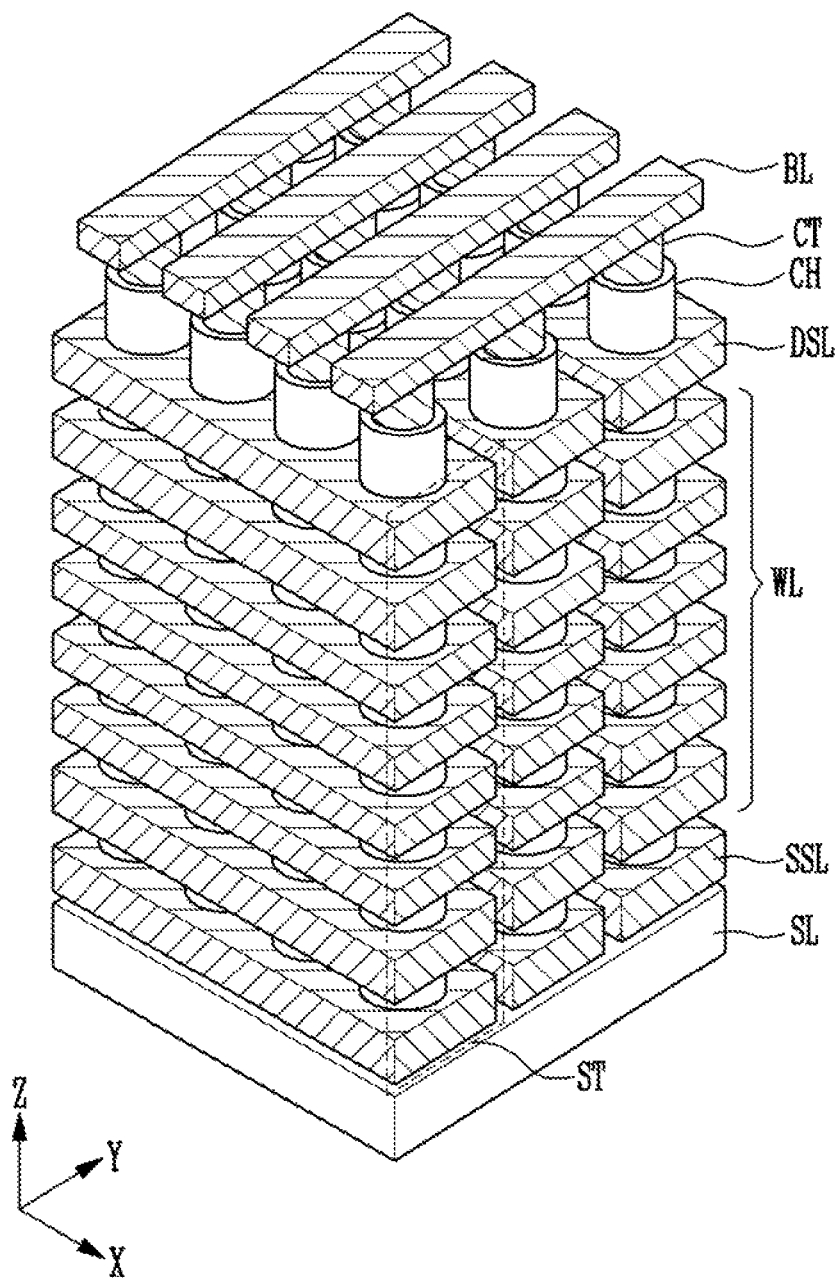
FIG. 3 is a perspective view illustrating an embodiment of a memory block formed in a three-dimensional (3D) structure.

FIG. 3 is a perspective view Illustrating an embodiment of a memory block formed in a three-dimensional (3D) structure.

Referring to FIG. 3, the memory block formed in the 3D structure may be formed on a substrate in a form of a vertical "I" shape in a z-axis direction, and may include strings arranged between bit lines BL and a source line SL. The structure may also be called Bit Cost Scalable (BiCS). For example, when the source line SL is horizontally formed on the substrate, the strings ST having the BiCS structure may be formed on the source line SL in a vertical direction.

More particularly, the strings ST may Include source select lines SSL, word lines WL, and drain select lines DSL, which are arranged in a first direction (i.e., Y-axis direction), and are stacked while being spaced apart from one another. The numbers of source select lines SSL, word lines WL, and drain select lines DSL are not limited to the number illustrated in FIG. 3, and may be different depending on a memory device. Further, the strings ST may include vertical channel layers CH, which vertically pass through the source select lines SSL, the word lines WL, and the drain select lines DSL, and bit lines BL, which are in contact to upper parts of the vertical channel layers CH protruding from upper parts of the drain select lines DSL and are arranged in a second direction (i.e., X-axis direction) orthogonal to the first direction (i.e., Y-direction).

The memory cells may be formed between the word lines WL and the vertical channel layers CH. A contact plug CT may be further formed between the bit lines BL and the vertical channel layers CH. The memory cells connected to the same word line is referred to as a page. The program operation may be performed in a page unit, and a partial erase operation may be performed on one or more pages.

Figure 4:
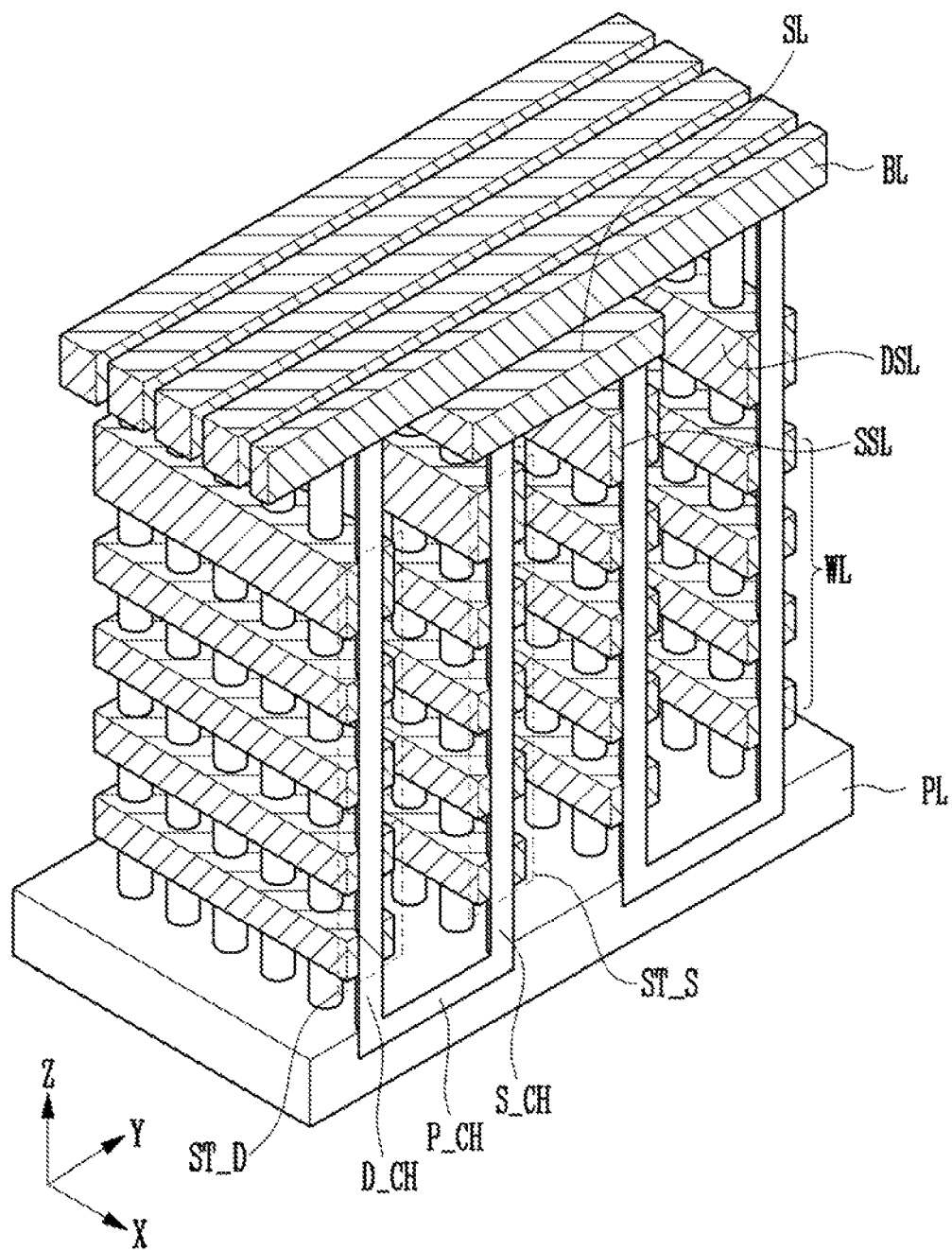
FIG. 4 is a perspective view illustrating another embodiment of a memory block formed in a three-dimensional (3D) structure.

FIG. 4 is a perspective view Illustrating another embodiment of a memory block formed in a three-dimensional (3D) structure.

Referring to FIG. 4, the memory block formed in the 3D structure may be formed on a substrate in a form of a vertical "U" shape in a z-axis direction, and may include source strings ST_S and drain strings ST_D connected between bit lines BL and a source line SL. The source strings ST_S and the drain strings ST_D may be connected with each other through a pipe channel P_CH and may be formed in a U-shape. The pipe channel P_CH may be formed within a pipe line PL. More particularly, the source strings ST_S may be vertically arranged between the source lines SL and the pipe line PL, and the drain strings ST_D may be vertically arranged between the bit lines BL and the pipe line PL. The structure may also be called Pipe-shaped Bit Cost Scalable (P-BiCS).

More particularly, the drain strings ST_D may include word lines WL and a drain select line DSL, which are arranged in a first direction (i.e., Y-axis direction) and are stacked while being spaced apart from each other, and drain vertical channel layers D_CH vertically passing through the word lines WL and the drain select line DSL. The source strings ST_S may include the word lines WL and a source select line SSL, which are arranged in the first direction (i.e., Y-axis direction) and are stacked while being spaced apart from each other, and source vertical channel layers S_CH vertically passing through the word lines WL and the source select line SSL. The drain vertical channel layers D_CH and the source vertical channel layers S_CH may be connected with each other by the pipe channel layers P_CH within the pipe line PL. The bit lines BL may be in contact with upper parts of the drain vertical channel layers D_CH protruding from the upper part of the drain select line DSL and arranged in a second direction (i.e., X-axis direction) orthogonal to the first direction (i.e., Y-axis direction).

Figure 5:
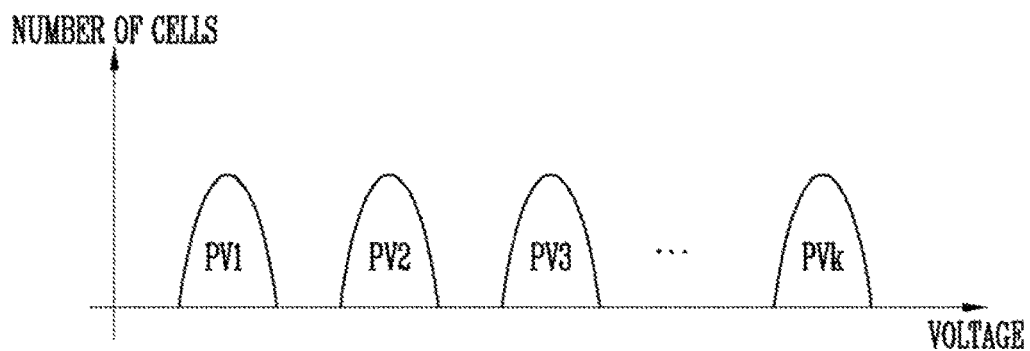
FIG. 5 is a diagram illustrating a threshold voltage distribution according to a program state of memory cells.

FIG. 5 is a diagram illustrating a threshold voltage distribution according to a program state of the memory cells.

Referring to FIG. 5, each of the memory cells may store data including a plurality of bits, and each data may be classified by a threshold voltage distribution. For example, the memory cells may be programmed into various program states according to a target voltage during the program operation. For example, the target voltage may be set with one of first to kth target voltages PV1 to PVK (where K is a positive integer), and the memory cells may be programmed in different states according to the target voltages, respectively.

Figure 6:
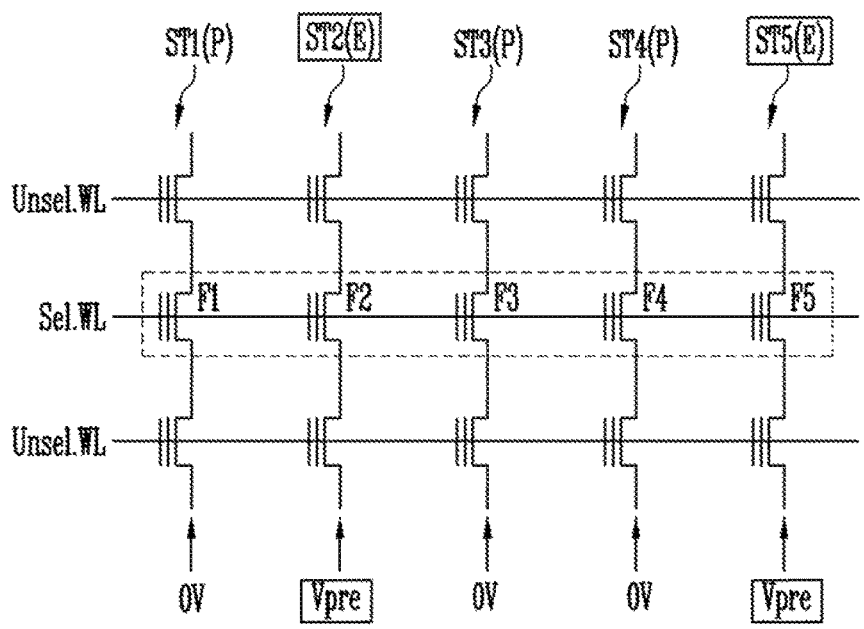
FIG. 6 is a diagram illustrating voltages of channels according to program data during a program operation.

FIG. 6 is a diagram illustrating voltages of channels according to program data during a program operation.

Referring to FIG. 6, the memory cells Included in the memory block may be programmed in a page unit. One page means a group of memory cells commonly connected to one word line. The description will be given based on five cell strings ST1 to ST5 as an example.

Each of the first to fifth cell strings ST1 to ST5 may include a plurality of memory cells. Among the plurality of memory cells, first to fifth memory cells F1 to F5, which are included in each of the first to fifth cell strings ST1 to ST5 and are commonly connected to a selected word line Sel. WL, may configure one page. The program operation is performed in the page unit, so that when the program operation of the selected page is performed, the remaining pages are non-selected pages. It is assumed that among the first to fifth memory cells, the first, third, and fourth memory cells F1, F3, and F4 are selected memory cells, which are the program targets, and the remaining second and fifth memory cells F2 and F5 are non-selected memory cells. In this case, potentials of the channels of first, third, and fourth cell strings ST1(P), ST3(P), ST4(P) including the selected memory cells F1, F3, and F4 may be 0 V, while potentials of the channels of the second and fifth strings ST2(E) and ST5(E) including the non-selected memory cells F2 and F5 may be increased to a precharge voltage Vpre.

The precharge voltage Vpre may be applied through the source line or the bit lines. When the precharge voltage Vpre is applied through the source line, all of the channels of the first to fifth cell strings ST1 to ST5 may be precharged by applying the precharge voltage Vpre through the source line, and then the channels of the selected cell strings ST1, ST3, and ST4 may be discharged through the bit lines according to program data and may be decreased to 0 V. When the precharge voltage Vpre is applied through the bit lines, all of the channels of the first to fifth cell strings ST1 to ST5 may be precharged by applying the precharge voltage Vpre through the bit lines, and then the channels of the selected cell strings ST1, ST3, and ST4 may be discharged through the bit lines according to program data and may be decreased to 0 V.

In an embodiment below, a method of controlling the precharge voltage Vpre of the channel according to a target voltage, a verify voltage, or a program time will be described.

Figure 7:
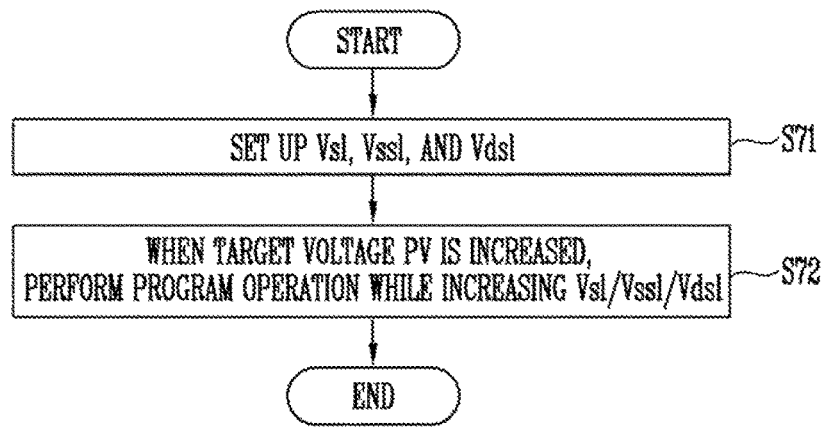
FIG. 7 is a flowchart illustrating a program operation according to an embodiment of the present disclosure.

FIG. 7 is a flowchart illustrating a program operation according to an embodiment of the present disclosure.

Referring to FIG. 7, when a program command is received, the control logic 300 of FIG. 2 sets up a source line voltage Vsl, a source select line voltage Vssl, and a drain select line voltage Vdsl (S71). In this case, the control logic 300 may set up a program voltage, a pass voltage, and the like other than the aforementioned voltages. In operation "S71", the set-up voltages may be defined as start voltages of the respective voltages. For example, the source line voltage Vsl set up in operation "S71" may be a start source line voltage, the source select line voltage Vssl set up in operation "S71" may be a start source select line voltage, and the drain select line voltage Vdsl set up in operation "S71" may be a start drain select line voltage.

When the voltages to be used in a program operation are set as default values (S71), a program operation of the selected memory cells is performed (S72). Particularly, the program operation may be performed to while increasing the source line voltage Vsl, the source select line voltage Vssl, or the drain select line voltage Vdsl according to an increase of a target voltage PV.

A particular embodiment of operation S71 will be described below.

Figure 8:
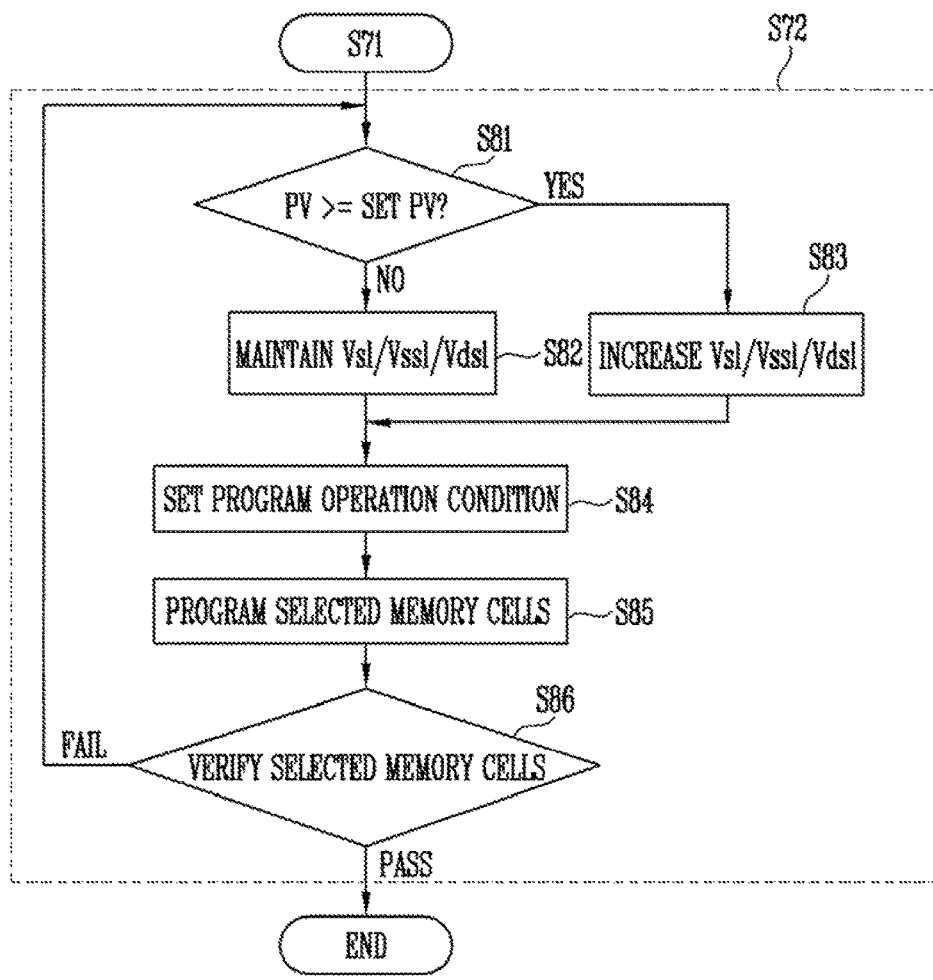
FIGS. 8 and 9 are flowcharts illustrating a particular embodiment of the program operation of FIG. 7.
Figure 9:
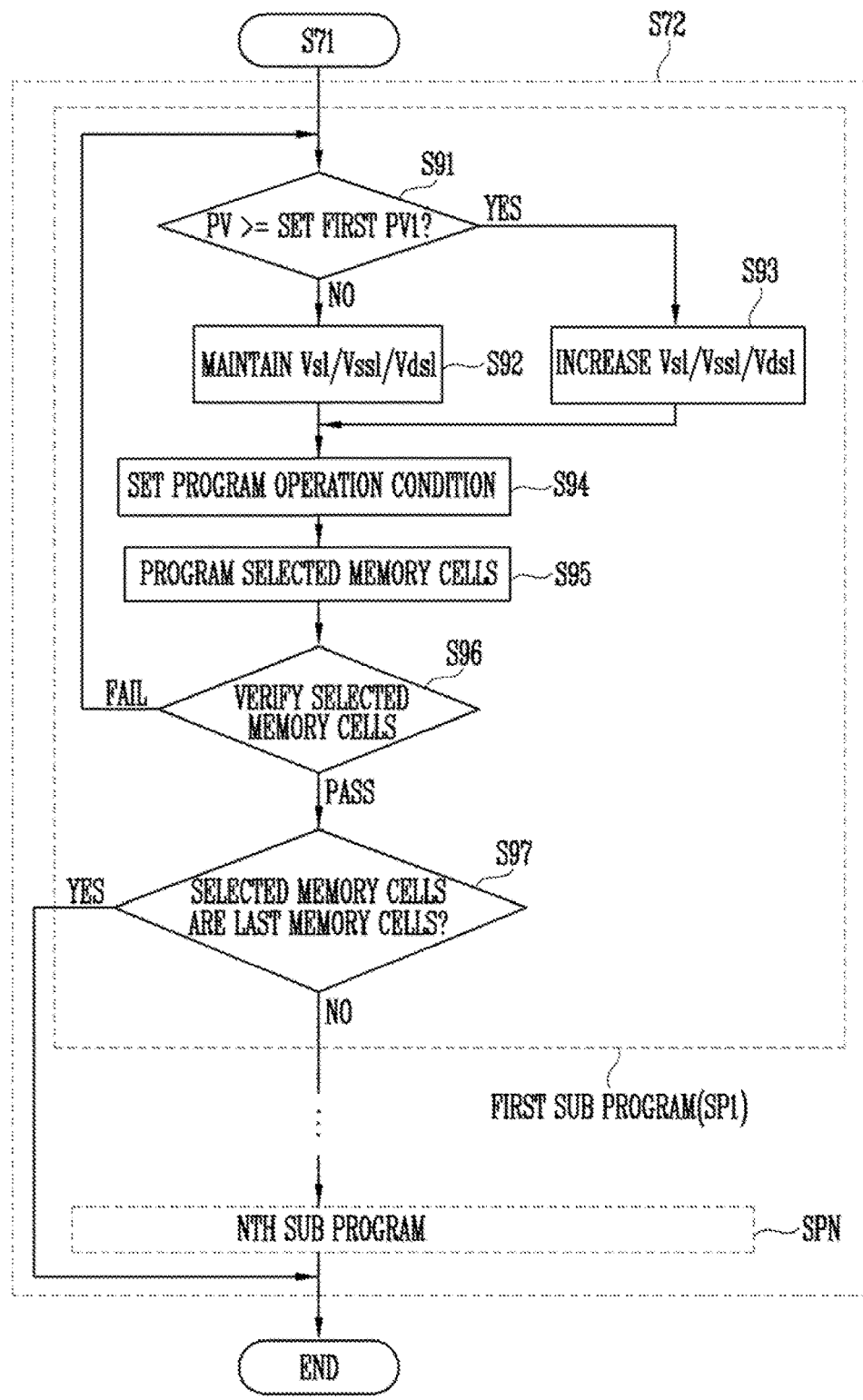

FIGS. 8 and 9 are flowcharts illustrating a particular embodiment of the program operation of FIG. 7.

Referring to FIG. 8, when the selected memory cells are programmed with the set target voltage PV during the program operation of the selected memory cells included in the selected page, the program operation may be performed by increasing the source line voltage Vsl, the source select line voltage Vssl, or the drain select line voltage Vdsl. Here, the set target voltage PV may be set with any one of a plurality of target voltages of the memory cells which are targets for the program. The set target voltage PV may be set among the plurality of target voltages according to the degree of deterioration of program disturb. For example, during a test program operation of the memory device, the set target voltage PV may be set with a target voltage when the deterioration of the disturb is sharply increased.

When operation "S71" is completed, it is determined whether the target voltage PV of the selected memory cells is equal to or higher than the set target voltage PV (S81).

When the target voltage PV of the selected memory cells is lower than the set target voltage PV (S81, No), the source line voltage Vsl, the source select line voltage Vssl, or the drain select line voltage Vdsl set up in operation "S71" are maintained as they are (S82). When the target voltage PV of the selected memory cells is equal to or higher than the set target voltage PV (S81, Yes), the source line voltage Vsl, the source select line voltage Vssl, or the drain select line voltage Vdsl are set to be higher than the voltage set up in operation "S71" (S83).

When operation "S82" or "S83" Is completed, a program operation condition is set (S84). The program operation condition may include a condition of various voltages required for the program operation. The voltages for precharging the bit lines are set in operation "S82" or "S83", so that the remaining voltages required for the program operation may be set in operation "S84". For example, in operation "S84", a program voltage, a pass voltage, a verify voltage, and the like may be set.

Next, a program operation of the selected memory cells is performed (S85). That is, when the target voltage of the selected memory cells is low, the program operation is performed by using the source line voltage Vsl, the source select line voltage Vssl, and the drain select line voltage Vdsl set up in operation "S71". When the target voltage of the selected memory cells is increased to a specific level or more, any one or a plurality of voltage among the source line voltage Vsl, the source select line voltage Vssl, or the drain select line voltage Vdsl set up in operation "S71" is increased, and the program operation is performed by using the increased voltages. For example, when it is assumed that the source line voltage Vsl set up in operation "S71" has a first voltage, the source line voltage Vsl may to be maintained with the first voltage in operation "S82", while the source line voltage Vsl may be set up with a second voltage higher than the first voltage in operation "S83". In operation "S85", the program operation using the voltages set up in operation "S82" or "S83" and operation "S84" is performed.

The program operation may be performed in an incremental step pulse program (ISPP) scheme increasing the program voltage stepwise. For example, the program operation, in which an operation of applying the program voltage to the selected word line and an operation of performing a verify operation for determining whether threshold voltages of the memory cells are increased to the target voltage are included in one program loop, may be performed. Accordingly, during the performance of the program operation, the plurality of program loops may be performed until the threshold voltages of the selected memory cells are increased to the target voltage.

The source line voltage Vsl having a positive voltage may be applied to the source line SL before the program voltage is applied to the selected word line in order to apply the precharge voltage Vpre (see FIG. 6) to the channels ST2 and ST5 (FIG. 6) of the non-selected cell strings. Next, when the source select line voltage Vssl having a positive voltage is applied to the source select lines SSL and source select transistors are turned on, the source line voltage Vsl Is applied to the channel, so that the potential of the channel may be increased to the precharge voltage Vpre. Accordingly, the precharge voltage Vpre may be a voltage obtained by subtracting the threshold voltages of the source select transistors from the source line voltage Vsl. When all of the source select transistors included in the selected memory block are turned on, the precharge voltage Vpre is applied to all of the channels of the cell strings included in the selected memory block. Next, a program allowable voltage or a program inhibition voltage is applied to the bit lines according to the program data stored in the page buffer unit 230 of FIG. 2. For example, the program allowable voltage may be 0 V, and the program inhibition voltage may be a positive voltage. Next, when the drain select line voltage Vdsl is applied to the drain select lines DSL and the drain select transistors are turned on, the potentials of the cell strings may be varied according to the potentials of the bit lines. For example, the potentials of the channels of the cell strings connected to the bit lines, to which the program allowable voltage is applied, may be decreased to 0 V, and the potentials of the channels of the cell strings connected to the bit lines, to which the program inhibition voltage is applied, may be maintained with the precharge voltage. Next, the pass voltage is applied to the non-selected word lines, and the program voltage is applied to the selected word line, so that the memory cells may be programmed while the threshold voltages of the memory cells among the memory cells connected to the selected word lines included in the cell strings, of which the potentials of the channels are 0 V, are increased.

After the program voltage is applied to the selected word line for a predetermined time, a verify operation for determining whether the threshold voltages of the selected memory cells are increased to the target voltage PV is performed (S86). When all of the threshold voltages of the selected memory cells become the same as or higher than the target voltage, it is determined that the verify operation is passed and the program operation is terminated. When the selected memory cells, of which the threshold voltages are lower than the target voltage, are detected, it is determined that the verify operation is failed, and the method is performed from operation "S81" again.

By the aforementioned method, operations "S81" to "S86 are repeated until all of the threshold voltages of the selected memory cells become higher than the target voltage PV. Particularly, in operation "S83", any one of the source line voltage Vsl, the source select line voltage Vssl, and the drain select line voltage Vdsl may be increased, or the plurality of voltages among them may be increased. However, when the potentials of the channels of the cell strings are increased to the precharge voltage Vpre through the source line SL, any one of or both the source line voltage Vsl and the source select line voltage Vssl except for the drain select line voltage Vdsl may be increased. When the potentials of the channels of the cell strings are increased to the precharge voltage Vpre through the bit line BL, the drain select line voltage Vdsl except for the source line voltage Vsl and the source select line voltage Vssl may be increased.

In FIG. 8, in a case where the number of set target voltages PV is one, when the memory cells are programmed according to the target voltage lower than the set target voltage PV, the previously set-up source line voltage Vsl, source select line voltage Vssl, or drain select line voltage to Vdsl is used. In contrast, when the memory cells are programmed according to the target voltage equal to or higher than the set target voltage PV, the source line voltage Vsl, the source select line voltage Vssl, or the drain select line voltage Vdsl higher than the previously set-up source line voltage Vsl, source select line voltage Vssl, and drain select line voltage Vdsl are used.

As another embodiment, a plurality of target voltages PV may also be set. This will be described with reference to FIG. 9.

Referring to FIG. 9, the plurality of target voltages PV may be set before a program operation is performed. For example, set first to $N^{th}$ target voltages PV1 to PVN (where N is a positive integer) may be set in advance. The set first to $N^{th}$ target voltages PV1 to PVN may be set by performing a test program operation as described with reference to FIG. 8. For example, the set first to $N^{th}$ target voltages PV1 to PVN may be set according to the degree of deterioration of program disturb. Among the set first to $N^{th}$ target voltages PV1 to PVN, the set first target voltage PV1 may be lowest, and the set $N^{th}$ target voltage PVN may be highest.

Operation "S72" may include first to $N^{th}$ sub programs SP1 to SPN (where N is a positive integer). The first to $N^{th}$ sub programs SP1 to SPN may be performed according to the first to $N^{th}$ target voltages PV1 to PVN, respectively. For example, the first sub program SP1 may be performed until the voltage of the memory cells becomes higher than the first target voltage PV1. Further, when a verify operation for the first target voltage PV1 is passed, the second sub program SP2 is performed on the to second target voltage PV2 higher than the first target voltage PV1. By the method, when up to the $N^{th}$ sub program SPN for the $N^{th}$ target voltage PVN is performed, the program operation may be terminated. The first to $N^{th}$ sub programs SP1 to SPN may be performed by the same method with the different target voltages.

For convenience of the description, the first sub program SP1 will be described in detail below.

When the first sub program SP1 is started, it is determined whether the target voltage PV of the selected memory cells is equal to or higher than the set first target voltage PV1 which is lowest among the first to $N^{th}$ target voltages PV1 to PVN (S91). When the target voltage PV of the selected memory cells is lower than the set first target voltage PV1 (S91, No), the source line voltage Vsl, source select line voltage Vssl, and drain select line voltage Vdsl set up in operation "S71" are maintained as they are (S92). When the target voltage PV of the selected memory cells is equal to or higher than the set first target voltage PV1 (S91, Yes), the source line voltage Vsl, the source select line voltage Vssl, or the drain select line voltage Vdsl are set to be higher than the voltage set up in operation "S71" (S93).

When operation "S92" or "93" is completed, a program operation condition is set (S94). The program operation condition may include a condition of various voltages required for the program operation. The voltages for precharging the bit lines are set in operation "S92" or "S93", so that the remaining voltage required for the program operation may be set to in operation "S94". For example, a program voltage, a pass voltage, a verify voltage, and the like may be set in operation "S94".

Next, the program operation of the selected memory cells is performed (S95). That is, when the target voltage of the selected memory cells is lower than the set first target voltage PV1, the program operation is performed by using the source line voltage Vsl, the source select line voltage Vssl, and the drain select line voltage Vdsl set up in operation "S92". In contrast, when the target voltage of the selected memory cells is higher than the set first target voltage PV1, any one of or a plurality of voltages among the source line voltage Vsl, the source select line voltage Vssl, and the drain select line voltage Vdsl set up in operation "S93" are increased, and the program operation using the increased voltages is performed. For example, when it is assumed that the source line voltage Vsl set up in operation "S71" has a first voltage, the source line voltage Vsl may be maintained with the first voltage in operation "S92", and the source line voltage Vsl may be set up with a second voltage higher than the first voltage in operation "S93". In operation "S95", the program operation using the voltages set up in operations "S92" or "S93" and "S94" is performed.

The first sub program SP1 may be performed in an incremental step pulse program (ISPP) scheme increasing the program voltage stepwise. For example, the program operation, in which an operation of applying the program voltage to the selected word line and an operation of performing a verify operation for determining whether threshold voltages of the memory cells are increased to the target voltage are included in one program loop, may be performed. Accordingly, during the performance of the program operation, the plurality of program loops may be performed until the threshold voltages of the selected memory cells are increased to the target voltage.

The source line voltage Vsl having a positive voltage may be applied to the source line SL before the program voltage is applied to the selected word line in order to apply the precharge voltage Vpre (see FIG. 6) to the channels ST2 and ST5 (see FIG. 6) of the non-selected cell strings. Next, when the source select line voltage Vssl having a positive voltage is applied to the source select lines SSL and source select transistors are turned on, the source line voltage Vsl is applied to the channel, so that the potential of the channel may be increased to the precharge voltage Vpre. Accordingly, the precharge voltage Vpre may be a voltage obtained by subtracting the threshold voltages of the source select transistors from the source line voltage Vsl. When all of the source select transistors included in the selected memory block are turned on, the precharge voltage Vpre is applied to all of the channels of the cell strings included in the selected memory block. Next, a program allowable voltage or a program inhibition voltage is applied to the bit lines according to the program data stored in the page buffer unit 230 of FIG. 2. For example, the program allowable voltage may be 0 V, and the program inhibition voltage may be a positive voltage. Next, when the drain select line voltage Vdsl is applied to the drain select lines DSL and the drain select transistors are turned on, the potentials of the cell strings may be varied according to the potentials of the bit lines. For example, the potentials of the channels of the cell strings connected to the bit lines, to which the program allowable voltage is applied, may be decreased to 0 V, and the potentials of the channels of the cell strings connected to the bit lines, to which the program inhibition voltage is applied, may be maintained with the precharge voltage. Next, the pass voltage is applied to the non-selected word lines, and the program voltage is applied to the selected word line, so that the memory cells may be programmed while the threshold voltages of the memory cells among the memory cells connected to the selected word lines included in the cell strings, of which the potentials of the channels are 0 V, are increased.

After the program voltage is applied to the selected word line for a predetermined time, a verify operation for determining whether the threshold voltages of the selected memory cells are increased to the target voltage PV is performed (S96). When all of the threshold voltages of the selected memory cells become the same as or higher than the target voltage, it is determined that the verify operation is passed and the program operation of the corresponding memory cells is terminated. It is determined whether the selected memory cells, of which the program operation is terminated, are the last memory cells among the cells to be programmed (S97). When the selected memory cells are the last cells (S97, Yes), the program operation is terminated. When the selected memory cells are not the last cells (S97, No), the sub programs for programming the memory cells, of which the program operation is not completed, are sequentially performed.

The first to $N^{th}$ sub programs SP1 to SPN may be sequentially performed by the aforementioned method. When it is determined that the selected memory cells are the last memory cells in the $N^{th}$ sub program SPN, the program operation of the selected page may be terminated.

Figure 10:
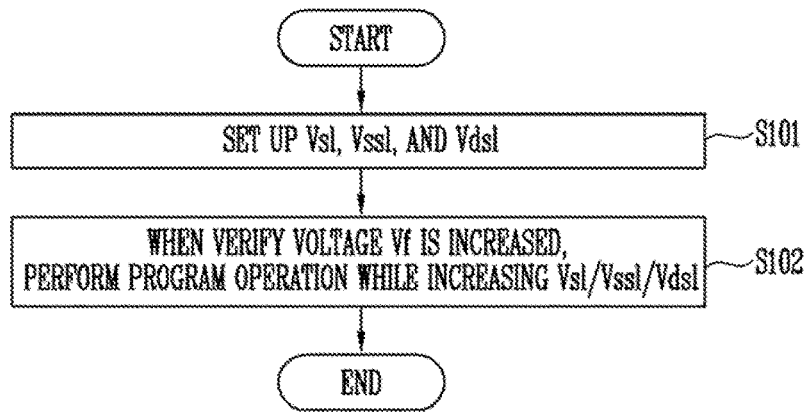
FIG. 10 is a flowchart illustrating a program operation according to another embodiment of the present disclosure.

FIG. 10 is a flowchart illustrating a program operation according to another embodiment of the present disclosure.

Referring to FIG. 10, when a program command is received, the control logic 300 of FIG. 2 sets up a source line voltage Vsl, a source select line voltage Vssl, and a drain select line voltage Vdsl (S101). In this case, the control logic 300 may set up a program voltage, a pass voltage, and the like other than the aforementioned voltages. In operation "S101", the set up voltages may be defined as start voltages of the respective voltages. For example, the source line voltage Vsl set up in operation "S101" may be a start source line voltage, the source select line voltage Vssl set up in operation "S101" may be a start source select line voltage, and the drain select line voltage Vdsl set up in operation "S101" may be a start drain select line voltage.

When the voltages to be used in a program operation are set as default values (S101), a program operation of the selected memory cells is performed (S102). Particularly, the program operation may be performed while increasing the source line voltage Vsl, the source select line voltage Vssl, or the drain select line voltage Vdsl according to an increase of a verify voltage Vf.

A particular embodiment of operation "S102" will be described below.

Figure 11:
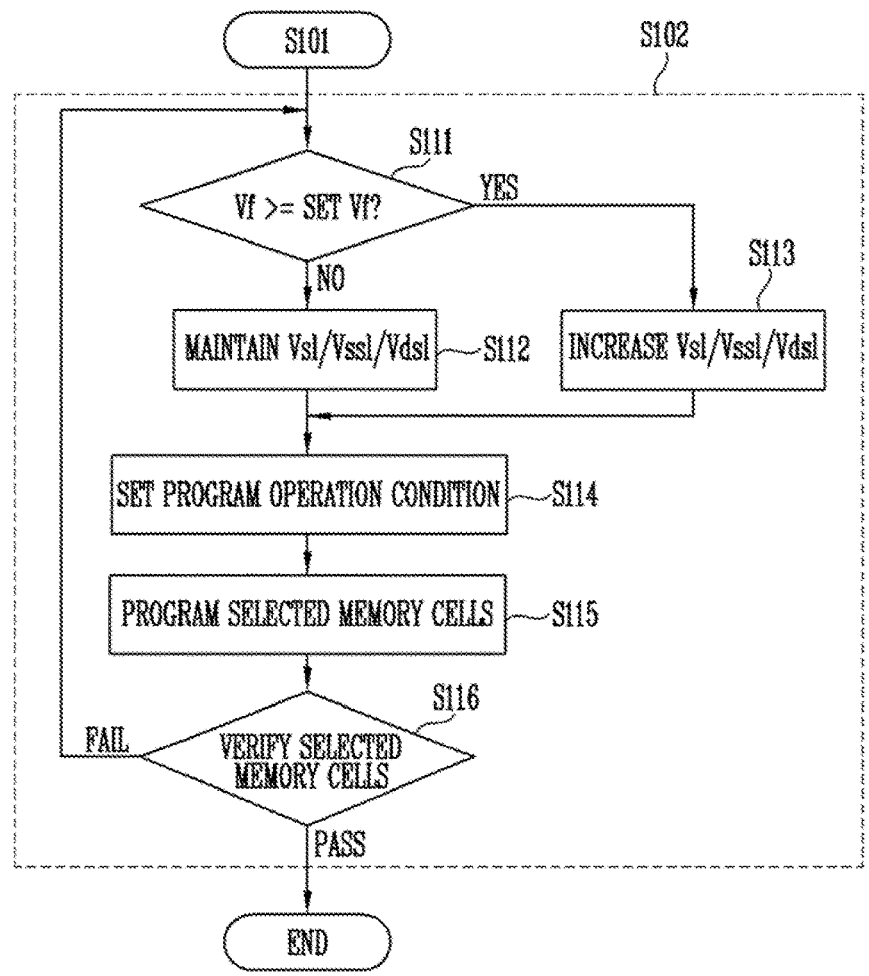
FIGS. 11 and 12 are flowcharts illustrating a particular embodiment of the program operation of FIG. 10.
Figure 12:
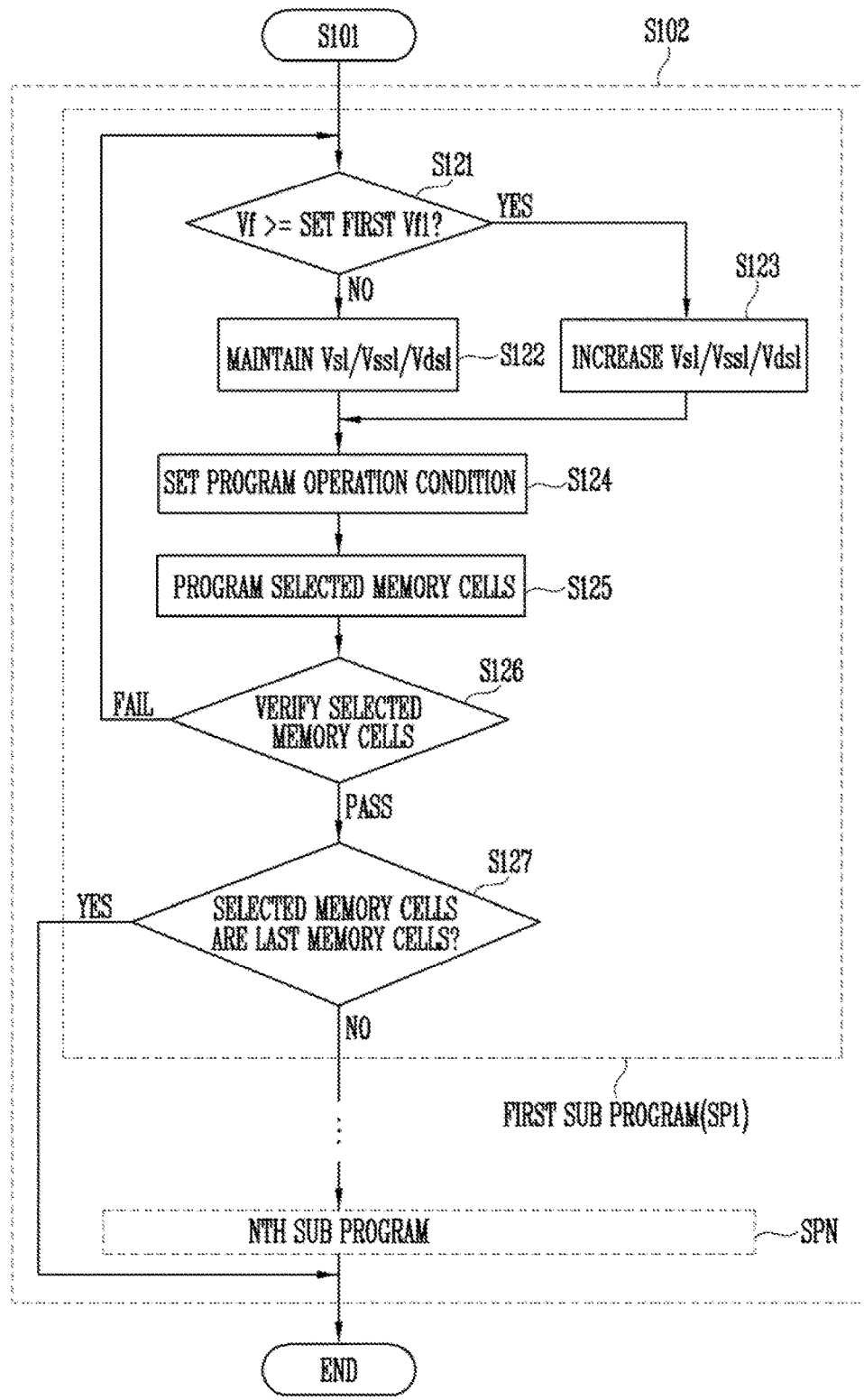

FIGS. 11 and 12 are flowcharts illustrating a particular embodiment of the program operation of FIG. 10.

Referring to FIG. 11, when the selected memory cells are programmed with the set verify voltage Vf during the program operation of the selected memory cells included in the selected page, the program operation may be performed by increasing the source line voltage Vsl, the source select line voltage Vssl, or the drain select line voltage Vdsl. The set verify voltage Vf may be set among the plurality of verify voltages according to the degree of deterioration of program disturb. For example, during a test program operation of the memory device, the set verify voltage Vf may be set with a verify voltage when a deterioration of a disturb is sharply increased.

When operation "S101" is completed, it is determined whether the verify voltage Vf of the selected memory cells is equal to or higher than the set verify voltage Vf (S111).

When the verify voltage Vf to be used in a program loop is lower than the set verify voltage Vf (S111, No), the source line voltage Vsl, source select line voltage Vssl, and drain select line voltage Vdsl set up in operation "S101" are maintained as they are (S112). When the verify voltage Vf to be used is equal to or higher than the set verify voltage Vf (S111, Yes), the source line voltage Vsl, the source select line voltage Vssl, or the drain select line voltage Vdsl are set to be higher than the voltage set up in operation "S101" (S113).

When operation "S112" or "S113" is completed, a program operation condition is set (S114). The program operation condition may include a condition of various voltages required for the program operation. The voltages for precharging the bit lines are set in operation "S112" or "S113", so that the remaining voltages required for the program operation may be set in operation "S114". For example, a program voltage, a pass voltage, a verify voltage, and the like may be set in operation "S114".

Next, the program operation of the selected memory cells is performed (S115). That is, when the verify voltage of the selected memory cells is low, the program operation is performed by using the source line voltage Vsl, the source select line voltage Vssl, and the drain select line voltage Vdsl set up in operation "S101". When the verify voltage of the selected memory cells is increased to a specific level or more, any one or a plurality of voltage among the source line voltage Vsl, the source select line voltage Vssl, or the drain select line voltage Vdsl set up in operation "S101" is increased, and the program operation is performed by using the increased voltages. For example, when it is assumed that the source line voltage Vsl set up in operation "S101" has a first voltage, the source line voltage Vsl may be maintained with the first voltage in operation "S112", while the source line voltage Vsl may be set up with a second voltage higher than the first voltage in operation "S113". In operation "S115", the program operation using the voltages set up in operations "S112" or "S113" and "S114" is performed.

The program operation may be performed in an incremental step pulse program (ISSP) scheme increasing the program voltage stepwise. For example, the program operation, in which an operation of applying the program voltage to the selected word line and an operation of performing a verify operation for determining whether threshold voltages of the memory cells are increased to the target voltage are included in one program loop, may be performed. Accordingly, during the performance of the program operation, the plurality of program loops may be performed until the threshold voltages of the selected memory cells are increased to the target voltage.

The source line voltage Vsl having a positive voltage may be applied to the source line SL before the program voltage is applied to the selected word line in order to apply the precharge voltage Vpre (see FIG. 6) to the channels ST2 and ST5 (see FIG. 6) of the non-selected cell strings. Next, when the source select line voltage Vssl having a positive voltage is applied to the source select lines SSL and source select transistors are turned on, the source line voltage Vsl is applied to the channel, so that the potential of the channel may be increased to the precharge voltage Vpre. Accordingly, the precharge voltage Vpre may be a voltage obtained by subtracting the threshold voltages of the source select transistors from the source line voltage Vsl. When all of the source select transistors Included in the selected memory block are turned on, the precharge voltage Vpre is applied to all of the channels of the cell strings included in the selected memory block. Next, a program allowable voltage or a program Inhibition voltage is applied to the bit lines according to the program data stored in the page buffer unit 230 of FIG. 2. For example, the program allowable voltage may be 0 V, and the program inhibition voltage may be a positive voltage. Next, when the drain select line voltage Vdsl is applied to the drain select lines DSL and the drain select transistors are turned on, the potentials of the cell strings may be varied according to the potentials of the bit lines. For example, the potentials of the channels of the cell strings connected to the bit lines, to which the program allowable voltage is applied, may be decreased to 0 V, and the potentials of the channels of the cell strings connected to the bit lines, to which the program inhibition voltage is applied, may be maintained with the precharge voltage. Next, the pass voltage is applied to the non-selected word lines, and the program voltage is applied to the selected word line, so that the memory cells may be programmed while the threshold voltages of the memory cells among the memory cells connected to the selected word lines included in the cell strings, of which the potentials of the channels are 0 V, are increased.

After the program voltage is applied to the selected word line for a predetermined time, a verify operation for determining whether the threshold voltages of the selected memory cells are increased to the target voltage is performed (S116). When all of the threshold voltages of the selected memory cells become the same as or higher than the target voltage, it is determined that the verify operation is passed and the program operation is terminated. When the selected memory cells, of which the threshold voltages are lower than the target voltage, are detected, it is determined that the verify operation is failed, and the method is performed to from operation "S111" again.

By the aforementioned method, operations "S111" to "S116 are repeated until all of the threshold voltages of the selected memory cells become higher than the target voltage. Particularly, in operation "S113", any one of the source line voltage Vsl, the source select line voltage Vssl, and the drain select line voltage Vdsl may be increased, or the plurality of voltages among them or all of the voltages may be Increased. However, when the potentials of the channels of the cell strings are increased to the precharge voltage Vpre through the source line SL, any one of or both the source line voltage Vsl and the source select line voltage Vssl except for the drain select line voltage Vdsl may be increased. When the potentials of the channels of the cell strings are increased to the precharge voltage Vpre through the bit line BL, the drain select line voltage Vdsl except for the source line voltage Vsl and the source select line voltage Vssl may be increased.

In FIG. 11, in a case where the number of set verify voltages Vf is one, when the memory cells are programmed by using the verify voltage lower than the set verify voltage Vf, the previously set-up source line voltage Vsl, source select line voltage Vssl, or drain select line voltage Vdsl Is used. In contrast, when the memory cells are programmed by using the verify voltage equal to or higher than the set verify voltage Vf, the source line voltage Vsl, the source select line voltage Vssl, or the drain select line voltage Vdsl higher than the previously set-up source line voltage Vsl, source select line voltage Vssl, and drain select line voltage Vdsl are used.

As another embodiment, a plurality of verify voltages Vf may also be set. This will be described with reference to FIG. 12.

Referring to FIG. 12, the plurality of verify voltages Vf may be set before a program operation is performed. For example, set first to $N^{th}$ verify voltages Vf1 to VfN (where N is a positive integer) may be set in advance. The set first to $N^{th}$ verify voltages Vf1 to VfN may be set by performing a test program operation as described with reference to FIG. 11. For example, the set first to $N^{th}$ verify voltages Vf1 to VfN may be set according to the degree of deterioration of program disturb. Among the set first to $N^{th}$ verify voltages Vf1 to VfN, the set first verify voltage Vf1 may be lowest, and the set $N^{th}$ verify voltage VfN may be highest.

Operation "S102" may include first to $N^{th}$ sub programs SP1 to SPN (where N is a positive integer). The first to $N^{th}$ sub programs SP1 to SPN may be performed according to the first to $N^{th}$ verify voltages Vf1 to VfN, respectively. For example, the first sub program SP1 may be performed until verify voltage becomes higher than the first verify voltage Vf1. Further, when a verify operation using the first verify voltage Vf1 is passed, the second sub program SP2 using the second verify voltage Vf2 higher than the first verify voltage Vf1 is performed. By the method, when up to the $N^{th}$ sub program SPN for the $N^{th}$ verify voltage VfN is performed, the program operation may be terminated. The first to $N^{th}$ sub programs SP1 to SPN may be performed by the same method with the different verify voltages.

For convenience of the description, the first sub program SP1 will be described in detail below.

When the first sub program SP1 is started, it is determined whether the verify voltage Vf to be used in the program group is equal to or higher than the set first verify voltage Vf1 which is lowest among the first to $N^{th}$ verify voltages Vf1 to VfN (S121). When the verify voltage Vf is lower than the set first verify voltage Vf1 (S121, No), the source line voltage Vsl, source select line voltage Vssl, and drain select line voltage Vdsl set up in operation "S101" are maintained as they are (S122). When the verify voltage Vf to be currently used in the program loop is equal to or higher than the set first verify voltage Vf1 (S121, Yes), the source line voltage Vsl, the source select line voltage Vssl, or the drain select line voltage Vdsl are set to be higher than the voltage set up in operation "S101" (S123).

When operation "S122" or "S123" is completed, a program operation condition is set (S124). The program operation condition may include a condition of various voltages required for the program operation. The voltages for precharging the bit lines are set in operation "S122" or "S123", so that the remaining voltages required for the program operation may be set in operation "S124". For example, a program voltage, a pass voltage, a verify voltage, and the like may be set in operation "S124".

Next, the program operation of the selected memory cells is performed (S125). That is, when the verify voltage to be used in the program loop is lower than the set first verify voltage Vf1, the program operation is performed by using the source line voltage Vsl, the source select line voltage Vssl, and the drain select line voltage Vdsl set up in operation "S122". In contrast, when the verify voltage is higher than the set first verify voltage Vf1, any one of or a plurality of voltages among the source line voltage Vsl, the source select line voltage Vssl, and the drain select line voltage Vdsl set up in operation "S123" are increased, and the program operation using the increased voltages is performed. For example, when it is assumed that the source line voltage Vsl set up in operation "S101" has a first voltage, the source line voltage Vsl may be maintained with the first voltage in operation "S122", and the source line voltage Vsl may be set up with a second voltage higher than the first voltage in operation "S123". In operation "S125", the program operation using the voltages set up in operations "S122" or "S123" and "S124" is performed.

The first sub program SP1 may be performed in an incremental step pulse program (ISPP) scheme increasing the program voltage stepwise. For example, the program operation, in which an operation of applying the program voltage to the selected word line and an operation of performing a verify operation for determining whether threshold voltages of the memory cells are increased to the target voltage by applying the verify voltage Vf to the selected word line are included in one program loop, may be performed. Accordingly, during the performance of the program operation, the plurality of program loops may be performed until the threshold voltages of the selected memory cells are increased to the target voltage.

The source line voltage Vsl having a positive voltage may be applied to the source line SL before the program voltage is applied to the selected word line in order to apply the precharge voltage Vpre (see FIG. 6) to the channels ST2 and ST5 (see FIG. 6) of the non-selected cell strings. Next, when the source select line voltage Vssl having a positive voltage is applied to the source select lines SSL and source select transistors are turned on, the source line voltage Vsl is applied to the channel, so that the potential of the channel may be increased to the precharge voltage Vpre. Accordingly, the precharge voltage Vpre may be a voltage obtained by subtracting the threshold voltages of the source select transistors from the source line voltage Vsl. When all of the source select transistors included in the selected memory block are turned on, the precharge voltage Vpre is applied to all of the channels of the cell strings included in the selected memory block. Next, a program allowable voltage or a program inhibition voltage is applied to the bit lines according to the program data stored in the page buffer unit 230 of FIG. 2. For example, the program allowable voltage may be 0 V, and the program inhibition voltage may be a positive voltage. Next, when the drain select line voltage Vdsl is applied to the drain select lines DSL and the drain select transistors are turned on, the potentials of the cell strings may be varied according to the potentials of the bit lines. For example, the potentials of the channels of the cell strings connected to the bit lines, to which the program allowable voltage is applied, may be decreased to 0 V, and the potentials of the channels of the cell strings connected to the bit lines, to which the program inhibition voltage is applied, may be maintained with the precharge voltage. Next, the pass voltage is applied to the non-selected word lines, and the program voltage is applied to the selected word line, so that the memory cells may be programmed while the threshold voltages of the memory cells among the memory cells connected to the selected word lines included in the cell strings, of which the potentials of the channels are 0 V, are increased.

After the program voltage is applied to the selected word line for a predetermined time, a verify operation for determining whether the threshold voltages of the selected memory cells are increased to the target voltage is performed (S126). During the verify operation, the verify voltage Vf set in operation "S122" or "S123" may be used. When all of the threshold voltages of the selected memory cells become the same as or higher than the target voltage, it is determined that the verify operation is passed and the program operation of the corresponding memory cells is terminated. It is determined whether the selected memory cells, of which the program operation is terminated, are the last memory cells among the cells to be programmed (S127). When the selected memory cells are the last cells (S127, Yes), the program operation is terminated. When the selected memory cells are not the last cells (S127, No), the sub programs for programming the memory cells, of which the program operation is not completed, are sequentially performed.

The first to $N^{th}$ sub programs SP1 to SPN may be sequentially performed by the aforementioned method. When it is determined that the selected memory cells are the last memory cells in the N$^{th}$ sub program SPN, the program operation of the selected page may be terminated.

Figure 13:
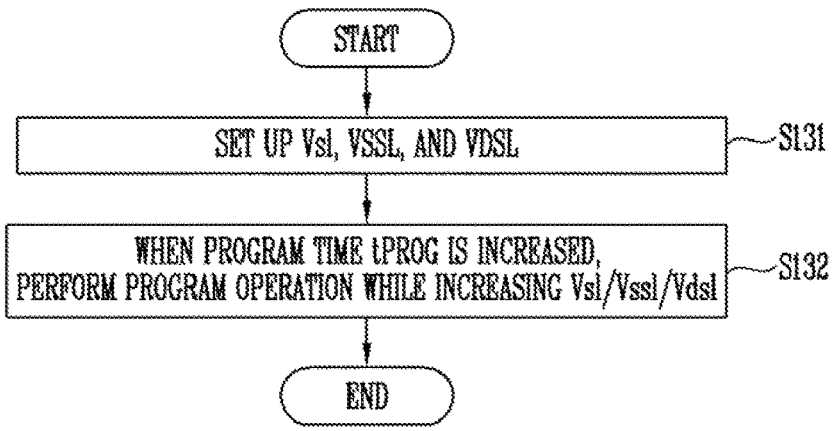
FIG. 13 is a flowchart illustrating a program operation according to another embodiment of the present disclosure.

FIG. 13 is a flowchart illustrating a program operation according to another embodiment of the present disclosure.

Referring to FIG. 13, when a program command is received, the control logic 300 of FIG. 2 sets up a source line voltage Vsl, a source select line voltage Vssl, and a drain select line voltage Vdsl (S131). In this case, the control logic 300 may set up a program voltage, a pass voltage, and the like other than the aforementioned voltages. In operation "S131", the set up voltages may be defined as start voltages of the respective voltages. For example, the source line voltage Vsl set up in operation "S131" may be a start source line voltage, the source select line voltage Vssl set up in operation "S131" may be a start source select line voltage, and the drain select line voltage Vdsl set up in operation "S131" may be a start drain select line voltage.

When the voltages to be used in a program operation are set as default values (S131), a program operation of the selected memory cells is performed (S132). Particularly, the program operation may be performed while increasing the source line voltage Vsl, the source select line voltage Vssl, or the drain select line voltage Vdsl according to an increase of a program time tPROG.

A particular embodiment of operation "S132" will be described below.

Figure 14:
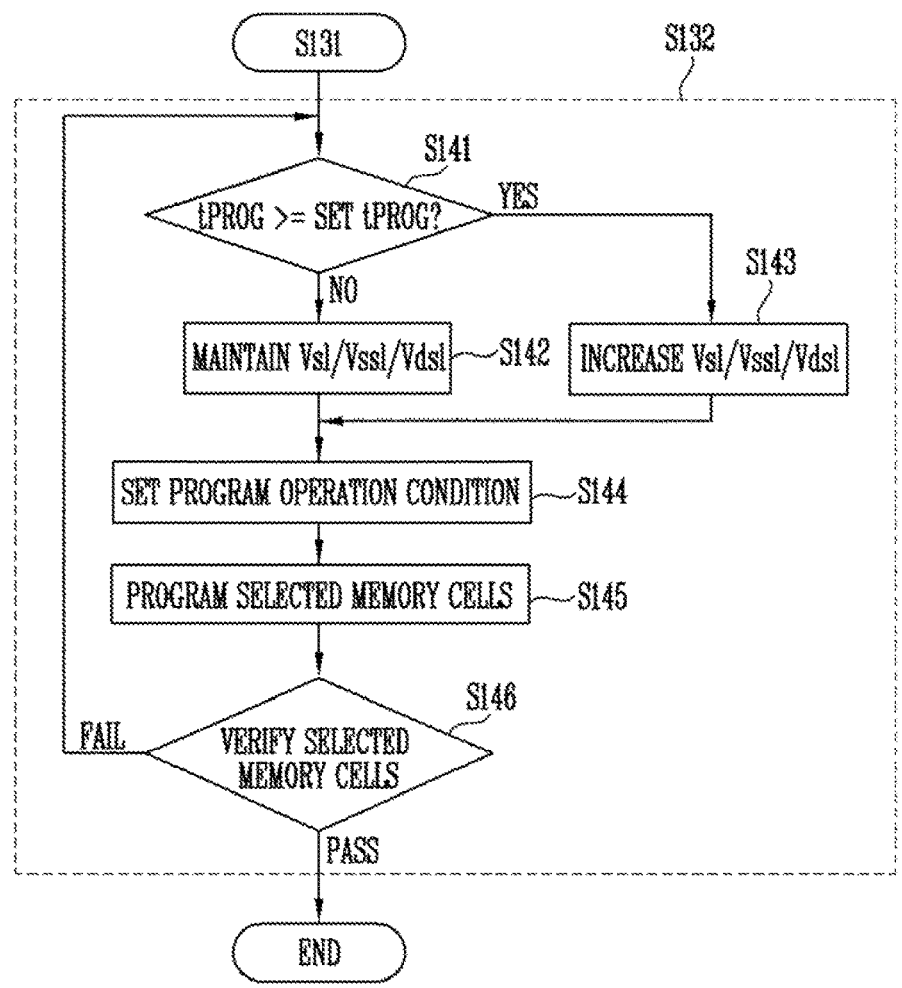
FIGS. 14 and 15 are flowcharts illustrating a particular embodiment of the program operation of FIG. 13.
Figure 15:
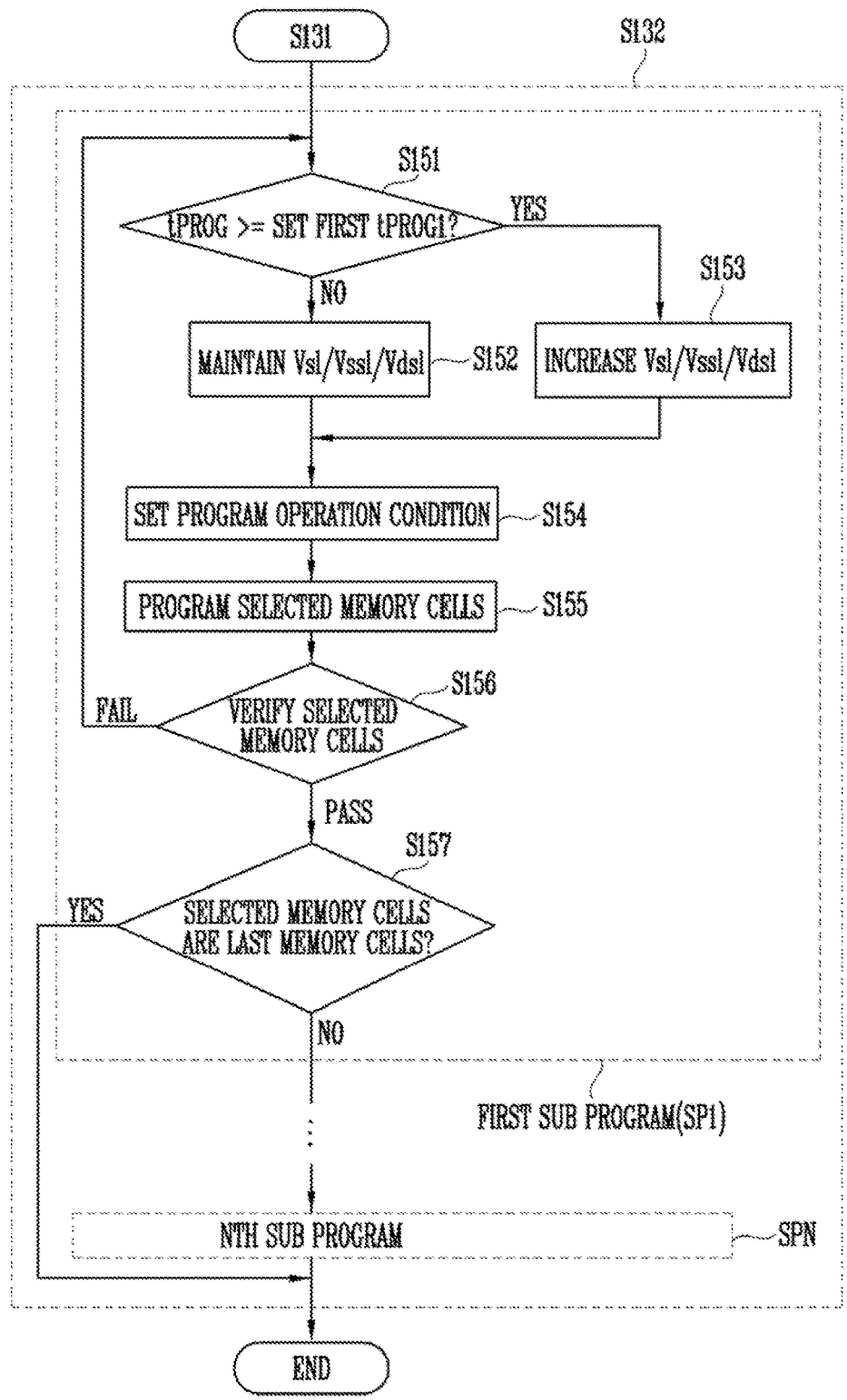

FIGS. 14 and 15 are flowcharts illustrating a particular embodiment of the program operation of FIG. 13.

Referring to FIG. 14, the program operation of the selected memory cells included in the selected page may be performed by increasing the source line voltage Vsl, the source select line voltage Vssl, or the drain select line voltage Vdsl according to the set program time tPROG. The to program time tPROG may be set with a time of the deterioration of program disturb during the performance of the program operation. For example, during a test program operation of the memory device, the program time tPROG may be set with a program time when a deterioration of a disturb is sharply increased. For example, the program time tPROG may be set with a time of the performance of the program operation or the number of times of the program loop.

When operation "S131" is completed, it is determined whether the program time tPROG is equal to or higher than the set program time tPROG (S141).

When the program time tPROG is shorter than the set program time tPROG (S141, No), the source line voltage Vsl, source select line voltage Vssl, and drain select line voltage Vdsl set up in operation "S131" are maintained as they are (S142). When the program time tPROG is equal to or longer than the set program time tPROG (S141, Yes), the source line voltage Vsl, the source select line voltage Vssl, or the drain select line voltage Vdsl are set to be higher than the voltage set up in operation "S131" (S143).

When operation "S142" or "S143" is completed, a program operation condition is set (S144). The program operation condition may include a condition of various voltages required for the program operation. The voltages for precharging the bit lines are set in operation "S142" or "S143", so that the remaining voltages required for the program operation may be set in operation "S144". For example, a program voltage, a pass to voltage, a verify voltage, and the like may be set in operation "S144".

Next, the program operation of the selected memory cells is performed (S145). That is, when the program time is short, the program operation is performed by using the source line voltage Vsl, the source select line voltage Vssl, and the drain select line voltage Vdsl set up in operation "S131". When the program time is increased, any one or a plurality of voltage among the source line voltage Vsl, the source select line voltage Vssl, or the drain select line voltage Vdsl set up in operation "S131" is increased, and the program operation is performed by using the increased voltages. For example, when it is assumed that the source line voltage Vsl set up in operation "S131" has a first voltage, the source line voltage Vsl may be maintained with the first voltage in operation "S142", while the source line voltage Vsl may be set up with a second voltage higher than the first voltage in operation "S143". In operation "S145" the program operation using the voltages set up in operations "S142" or "S143" and "S144" is performed.

The program operation may be performed in an incremental step pulse program (ISPP) scheme increasing the program voltage stepwise. For example, the program operation, in which an operation of applying the program voltage to the selected word line and an operation of performing a verify operation for determining whether threshold voltages of the memory cells are increased to the target voltage are included in one program loop, may be performed. Accordingly, during the performance of the program operation, the plurality of program loops may be performed until the to threshold voltages of the selected memory cells are increased to the target voltage.

The source line voltage Vsl having a positive voltage may be applied to the source line SL before the program voltage is applied to the selected word line in order to apply the precharge voltage Vpre (see FIG. 6) to the channels ST2 and ST5 (see FIG. 6) of the non-selected cell strings. Next, when the source select line voltage Vssl having a positive voltage is applied to the source select lines SSL and source select transistors are turned on, the source line voltage Vsl is applied to the channel, so that the potential of the channel may be increased to the precharge voltage Vpre. Accordingly, the precharge voltage Vpre may be a voltage obtained by subtracting the threshold voltages of the source select transistors from the source line voltage Vsl. When all of the source select transistors included in the selected memory block are turned on, the precharge voltage Vpre is applied to all of the channels of the cell strings included in the selected memory block. Next, a program allowable voltage or a program inhibition voltage is applied to the bit lines according to the program data stored in the page buffer unit 230 of FIG. 2. For example, the program allowable voltage may be 0 V, and the program inhibition voltage may be a positive voltage. Next, when the drain select line voltage Vdsl is applied to the drain select lines DSL and the drain select transistors are turned on, the potentials of the cell strings may be varied according to the potentials of the bit lines. For example, the potentials of the channels of the cell strings connected to the bit lines, to which the program allowable voltage is applied, may be decreased to 0 V, and the potentials of the channels of the cell strings connected to the bit lines, to which the program inhibition voltage is applied, may be maintained with the precharge voltage. Next, the pass voltage is applied to the non-selected word lines, and the program voltage is applied to the selected word line, so that the memory cells may be programmed while the threshold voltages of the memory cells among the memory cells connected to the selected word lines included in the cell strings, of which the potentials of the channels are 0 V, are increased.

After the program voltage is applied to the selected word line for a predetermined time, a verify operation for determining whether the threshold voltages of the selected memory cells are increased to the target voltage is performed (S146). When all of the threshold voltages of the selected memory cells become the same as or higher than the target voltage, it is determined that the verify operation is passed and the program operation is terminated. When the selected memory cells, of which the threshold voltages are lower than the target voltage, are detected, it is determined that the verify operation is failed, and the method is performed from operation "S141" again.

By the aforementioned method, operations "S141" to "S146 are repeated until all of the threshold voltages of the selected memory cells become higher than the target voltage. Particularly, in operation "S143", any one of the source line voltage Vsl, the source select line voltage Vssl, and the drain select line voltage Vdsl may be increased, or the plurality of voltages among them or all of the voltages may be increased. However, when the potentials of the channels of the cell strings are Increased to the precharge voltage Vpre through the source line SL, any one of or both the source line voltage Vsl and the source select line voltage Vssl except for the drain select line voltage Vdsl may be increased. When the potentials of the channels of the cell strings are increased to the precharge voltage Vpre through the bit line BL, the drain select line voltage Vdsl except for the source line voltage Vsl and the source select line voltage Vssl may be increased.

In FIG. 14, in a case where the number of set program times tPROG is one, when the program operation time is shorter than the set program time tPROG, the previously set-up source line voltage Vsl, source select line voltage Vssl, or drain select line voltage Vdsl is used. In contrast, when the program operation time is longer than the set program time tPROG, the source line voltage Vsl, the source select line voltage Vssl, or the drain select line voltage Vdsl higher than the previously set-up source line voltage Vsl, source select line voltage Vssl, and drain select line voltage Vdsl are used.

As another embodiment, a plurality of program times tPROG may also be set. This will be described with reference to FIG. 15.

Referring to FIG. 15, the plurality of program times tPROG may be set before a program operation is performed. For example, set first to $N^{th}$ program times tPROG1 to tPROGN (where N is a positive Integer) may be set in advance. The set first to $N^{th}$ program times tPROG1 to tPROGN may be set by performing a test program operation as described with reference to FIG. 14. For example, the set first to $N^{th}$ program times tPROG1 to tPROGN may be set according to the degree of deterioration of program disturb. Among the set first to $N^{th}$ program times tPROG1 to tPROGN, the set first program time tPROG1 may be shortest, and the set $N^{th}$ program time tPROGN may be longest.

Operation "S132" may include first to $N^{th}$ sub programs SP1 to SPN (where N is a positive integer). The first to $N^{th}$ sub programs SP1 to SPN may be performed according to the first to $N^{th}$ program times tPROG1 to tPROGN, respectively. For example, the first sub program SP1 is performed until the program operation time is longer than the first program time tPROG1. Further, when the verify operation is passed, the second sub program SP2 is performed according to the second program time tPROG2 longer than the first program time tPROG1. By the method, when up to the $N^{th}$ sub program SPN using the $N^{th}$ program time tPROGN is performed, the program operation may be terminated. The first to $N^{th}$ sub programs SP1 to SPN may be performed by the same method with the different program times.

For convenience of the description, the first sub program SP1 will be described in detail below.

When the first sub program SP1 is started, it is determined whether the program operation time is longer than the set first program time tPROG1 (S151). When the program operation time is shorter than the set first program time tPROG1 (S151, No), the source line voltage Vsl, source select line voltage Vssl, and drain select line voltage Vdsl set up in operation "S131" are maintained as they are (S152). When the program operation time is longer than the set first program time tPROG1 (S151, Yes), the source line voltage Vsl, the source select line voltage Vssl, or the drain select line voltage Vdsl are set to be higher than the voltage set up in operation "S131" (S153).

When operation "S152" or "S153" is completed, a program operation condition is set (S154). The program operation condition may include a condition of various voltages required for the program operation. The voltages for precharging the bit lines are set in operation "S152" or "S153", so that the remaining voltages required for the program operation may be set in operation "S154". For example, a program voltage, a pass voltage, a verify voltage, and the like may be set in operation "S154".

Next, the program operation of the selected memory cells is performed (S155). That is, when the program operation time is shorter than the set first program time tPROG1, the program operation is performed by using the source line voltage Vsl, the source select line voltage Vssl, and the drain select line voltage Vdsl set up in operation "S152" In contrast, when the program operation time is longer than the set first program time tPROG1, any one of or a plurality of voltages among the source line voltage Vsl, the source select line voltage Vssl, and the drain select line voltage Vdsl set up in operation "S153" are increased, and the program operation using the increased voltages is performed. For example, when it is assumed that the source line voltage Vsl set up in operation "S131" has a first voltage, the source line voltage Vsl may be maintained with the first voltage in operation "S152", and the source line voltage Vsl may be set up with a second voltage higher than the first voltage in operation "S153". In operation "S155", the program operation using the voltages set up in operations "S152" or "S153" and "S154" is performed.

The first sub program SP1 may be performed in an incremental step pulse program (ISPP) scheme increasing the program voltage stepwise. For example, the program operation, in which an operation of applying the program voltage to the selected word line and an operation of performing a verify operation for determining whether threshold voltages of the memory cells are increased to the target voltage are included in one program loop, may be performed. Accordingly, when the number of times of the program loop is increased, the program operation time is also increased.

The source line voltage Vsl having a positive voltage may be applied to the source line SL before the program voltage is applied to the selected word line in order to apply the precharge voltage Vpre (see FIG. 6) to the channels ST2 and ST5 (see FIG. 6) of the non-selected cell strings. Next, when the source select line voltage Vssl having a positive voltage is applied to the source select lines SSL and source select transistors are turned on, the source line voltage Vsl is applied to the channel, so that the potential of the channel may be increased to the precharge voltage Vpre. Accordingly, the precharge voltage Vpre may be a voltage obtained by subtracting the threshold voltages of the source select transistors from the source line voltage Vsl. When all of the source select transistors included in the selected memory block are turned on, the precharge voltage Vpre is applied to all of the channels of the cell strings included in the selected memory block. Next, a program allowable voltage or a program inhibition voltage is applied to the bit lines according to the program data stored in the page buffer unit 230 of FIG. 2. For example, the program allowable voltage may be 0 V, and the program Inhibition voltage may be a positive voltage. Next, when the drain select line voltage Vdsl is applied to the drain select lines DSL and the drain select transistors are turned on, the potentials of the cell strings may be varied according to the potentials of the bit lines. For example, the potentials of the channels of the cell strings connected to the bit lines, to which the program allowable voltage is applied, may be decreased to 0 V, and the potentials of the channels of the cell strings connected to the bit lines, to which the program inhibition voltage is applied, may be maintained with the precharge voltage. Next, the pass voltage is applied to the non-selected word lines, and the program voltage is applied to the selected word line, so that the memory cells may be programmed while the threshold voltages of the memory cells among the memory cells connected to the selected word lines included in the cell strings, of which the potentials of the channels are 0 V, are increased.

After the program voltage is applied to the selected word line for a predetermined time, a verify operation for determining whether the threshold voltages of the selected memory cells are increased to the target voltage is performed (S156). When all of the threshold voltages of the selected memory cells become the same as or higher than the target voltage, it is determined that the verify operation is passed and the program operation of the corresponding memory cells is terminated. It is determined whether the selected memory cells, of which the program operation is terminated, are the last memory cells among the cells to be programmed (S157). When the selected memory cells are the last cells (S157, Yes), the program operation is terminated. When the selected memory cells are not the last cells (S157, No), the sub programs for programming the memory cells, of which the program operation is not completed, are performed.

The first to $N^{th}$ sub programs SP1 to SPN may be sequentially performed by the aforementioned method. When it is determined that the selected memory cells are the last memory cells in the $N^{th}$ sub program SPN, the program operation of the selected page may be terminated.

Figure 16:
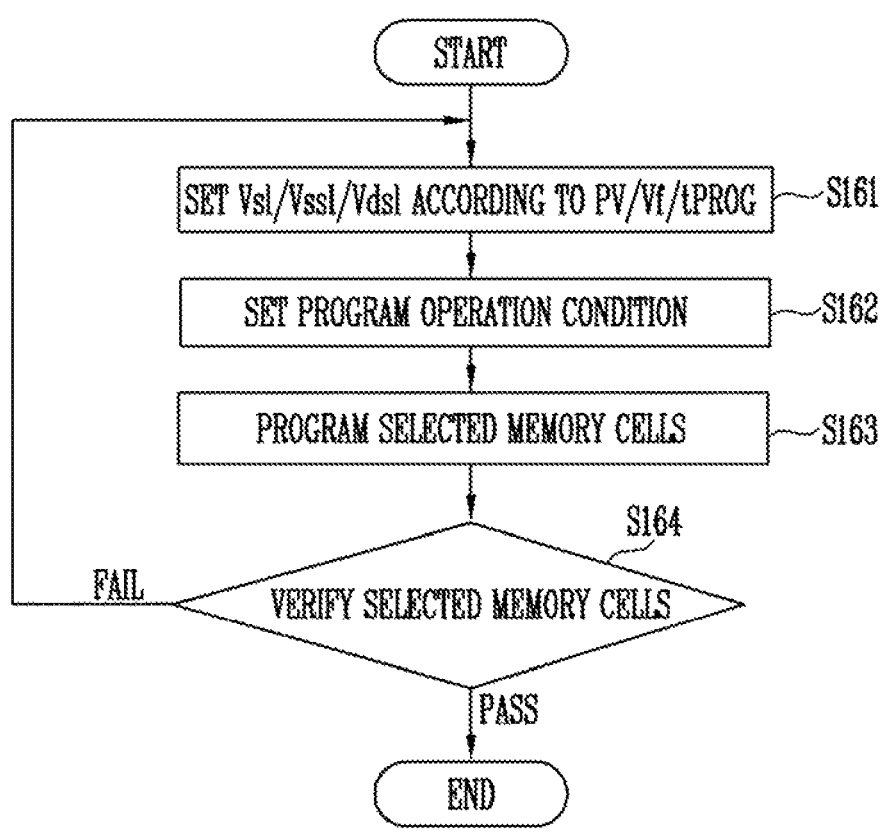
FIG. 16 is a flowchart illustrating a program operation according to an embodiment of the present disclosure.

FIG. 16 is a flowchart illustrating a program operation according to another embodiment of the present disclosure.

Referring to FIG. 16, when the program operation is started, the source line voltage Vsl, the source select line voltage Vssl, and the drain select line voltage Vdsl are set according to one or more of the target voltage PV, the verify voltage Vf, and the program time tPROG of the selected memory cells (S161). The source line voltage Vsl, the source select line voltage Vssl, and the drain select line voltage Vdsl may voltages when the bit lines are precharged. The source line voltage Vsl, the source select line voltage Vssl, and the drain select line voltage Vdsl may be maintained with initially set values, or may set to be higher than the initial set values according to at least one of the target voltage PV, the verify voltage Vf, and the program time tPROG. More particularly, when one or more of the target voltage PV, the verify voltage Vf, and the program time tPROG are higher than respective reference values, at least one of the source line voltage Vsl, the source select line voltage Vssl, and the drain select line voltage Vdsl may be set to be higher than the initial set value.

Next, the remaining conditions required for the program operation are set (S162). The program operation conditions may include a condition of various voltages required for the program operation. The voltages for precharging the bit lines are set in operation "S161", so that the remaining voltages required for the program operation may be set in operation "S162". For example, a program voltage, a pass voltage, a verify voltage, and the like may be set in operation "S162".

Next, the program operation of the selected memory cells is performed (S163). That is, when the target voltages PV of the selected memory cells are lower than a set reference value, the program operation is performed by using the source line voltage Vsl, the source select line voltage Vssl, and the drain select line voltage Vdsl set up in operation "S162". In contrast, when the target voltages PV of the selected memory cells are higher than the reference value, the program operation using at least one of the source line voltage Vsl, the source select line voltage Vssl, or the drain select line voltage Vdsl set up to be high in operation "S163" is performed.

After the program voltage is applied to the selected word line for a predetermined time, a verify operation for determining whether the threshold voltages of the selected memory cells are increased to the target voltage PV is performed (S164). When the threshold voltages of the selected memory cells are lower than the target voltage PV, it is determined that the verify operation is failed, and operations "S161" to "S164" are repeated until the threshold voltages of the selected memory cells are increased to be higher than the target voltage PV. In operation "S164", when all of the threshold voltages of the selected memory cells become higher than the target voltage PV, the verify operation is passed and the program operation of the corresponding memory cells is terminated.

Figure 17:
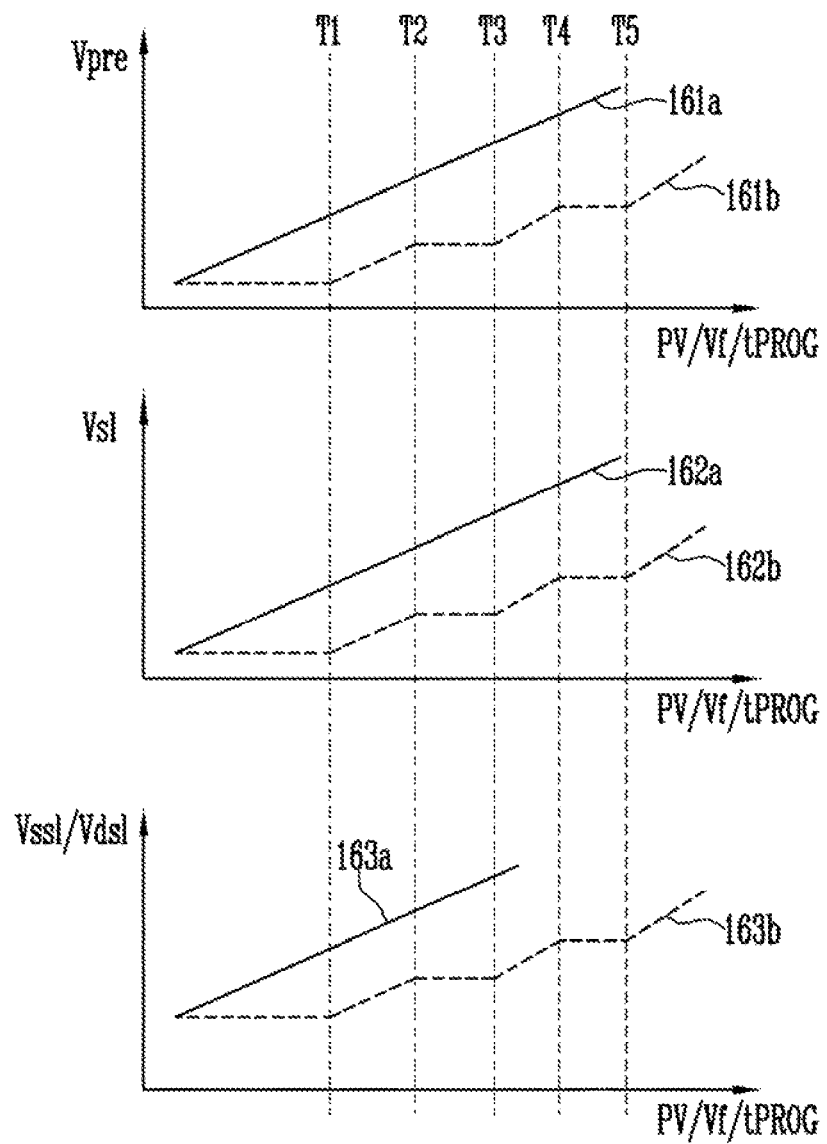
FIG. 17 is a diagram illustrating a precharge voltage of non-selected cell strings according to the embodiments of the present disclosure.

FIG. 17 is a diagram illustrating a precharge voltage of non-selected cell strings according to the embodiments of the present disclosure.

Referring to FIG. 17, in the aforementioned embodiment, it is possible to increase the precharge voltage Vpre of the channels of the non-selected cell strings (161a and 161b) by increasing the source line voltage Vsl, the source select line voltage Vssl, or the drain select line voltage Vdsl (162a, 162b, 163a, and 163b) according to an increase of the target voltage PV, the verify voltage Vf, or the program time tPROG. For example, when the source line voltage Vsl, the source select line voltage Vssl, or the drain select line voltage Vdsl are increased in proportion to the target voltage PV, the verify voltage Vf, or the program time tPROG (162a and 163a), the precharge voltage Vpre of the channels of the non-selected cell strings may be increased in proportion to the source line voltage Vsl, the source select line voltage Vssl, or the drain select line voltage Vdsl (161a). When the source line voltage Vsl, the source select line voltage Vssl, or the drain select line voltage Vdsl are increased stepwise (162b and 163b) in proportion to the target voltage PV, the verify voltage Vf, or the program time tPROG, the precharge voltage Vpre of the channels of the non-selected cell strings may be increased stepwise (161b) in proportion to the source line voltage Vsl, the source select line voltage Vssl, or the drain select line voltage Vdsl. Accordingly, it is possible to decrease the program disturb of the non-selected memory cells, thereby improving reliability of the program operation.

Figure 18:
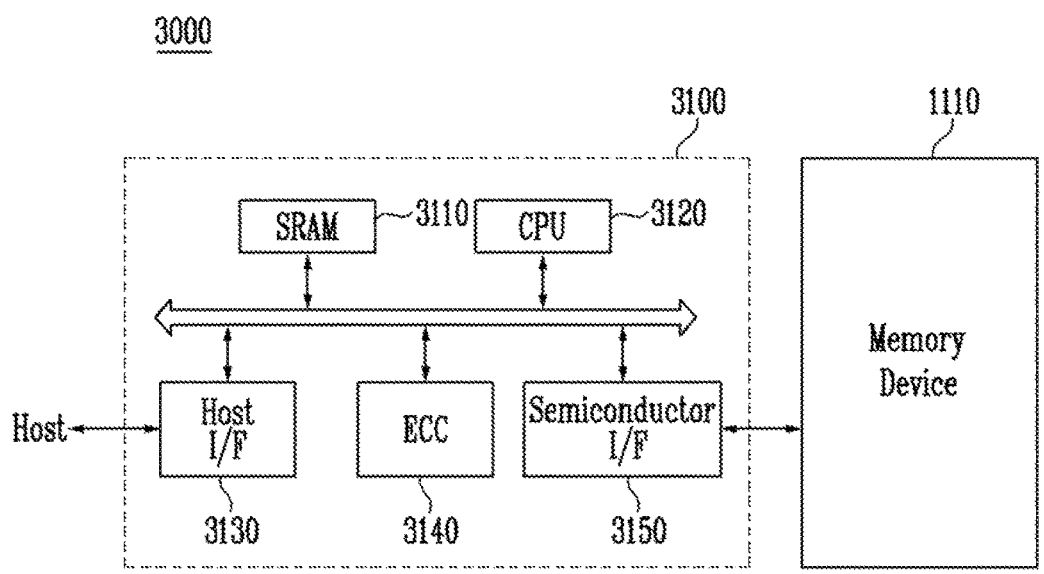
FIG. 18 is a block diagram illustrating a memory system including the memory device according to the embodiment of the present disclosure.

FIG. 18 is a block diagram illustrating a memory system 3000 including the memory device 1110 according to an embodiment of the present disclosure. Here, the memory device 1110 may have a configuration substantially the same as that of FIG. 2, so that a detailed description of the memory device 1110 will be omitted.

Referring to FIG. 18, the memory system 3000 may include a controller 3100 and the memory device 1110. The controller 3100 may be configured to control the memory device 1110, and may include a static random access memory (SRAM) 3110, a central processing unit (CPU) 3120, a host interface (I/F) 3130, an error correction circuit (ECC) 3140 and a semiconductor interface (I/F) 3150. The SRAM 3110 may be used as a working memory of the CPU 3120. The host Interface (I/F) 3130 may include a data exchange protocol of a host connected with the memory system 3000. The error correction circuit (ECC) 3140 provided in the controller 3100 may detect and correct an error included in data read from the memory device 1110. The semiconductor interface (I/F) 3150 may to interface with the memory device 1110. The CPU 3120 may perform a control operation for data exchange of the controller 3100. Further, although not illustrated in FIG. 18, the memory system 3000 may further include a read only memory (ROM) (not illustrated) for storing code data for interfacing with the host.

The memory system 3000 according to the present disclosure may be applied to one of a computer, a portable terminal, a Ultra Mobile PC (UMPC), a work station, a net-book computer, a personal digital assistant (PDA), a portable computer, a web tablet PC, a wireless phone, a mobile phone, a smart phone, a digital camera, a digital audio recorder, a digital audio player, a digital picture recorder, a digital picture player, a digital video recorder, a digital video player, a device capable of transceiving Information in a wireless environment, and various devices configuring a home network.

Figure 19:
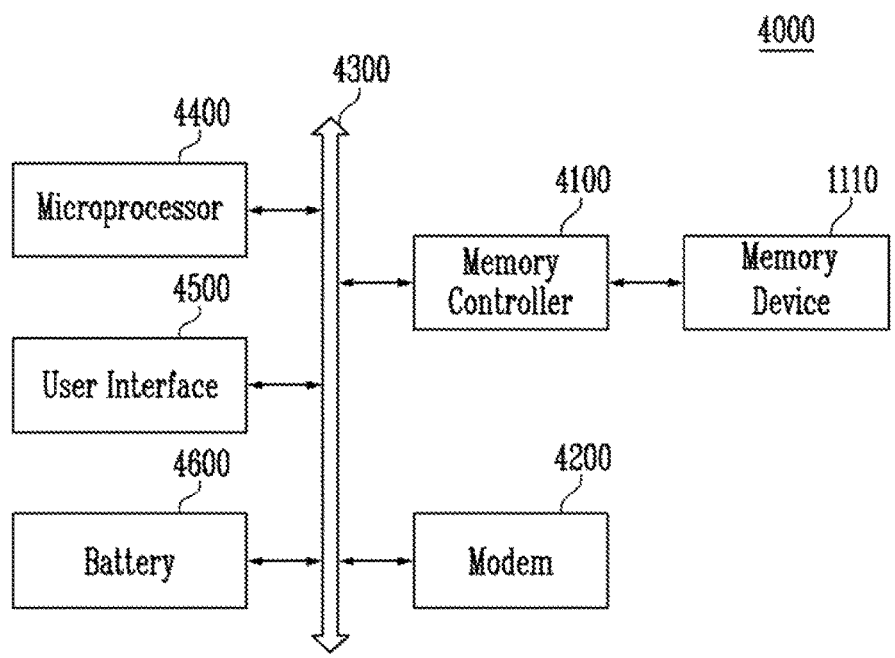
FIG. 19 is a diagram illustrating a schematic configuration of a computing system including the memory device according to the embodiment of the present disclosure.

FIG. 19 is a diagram illustrating a schematic configuration of a computing system 4000 including the memory device 1110 according to an embodiment of the present disclosure. Here, the memory device 1110 may have a configuration substantially the same as that of FIG. 2, so that a detailed description of the memory device 1110 will be omitted.

Referring to FIG. 19, the computing system 4000 may include the memory device 1110, a memory controller 4100, a modem 4200, a microprocessor 4400, and a user interface 4500 which are electrically connected to a bus 4300. In a case where the computing system 4000 according to the present disclosure is a mobile device, a battery 4600 for supplying an operating voltage of the computing system 4000 may be further provided. Although it is not illustrated in the drawing, the computing system 4000 according to the present disclosure may further include an application chipset, a Camera Image Processor (CIS), a mobile dynamic random access memory (DRAM), and the like.

The memory controller 4100 and the memory device 1110 may configure a Solid State Drive/Disk (SSD).

The system according to the present disclosure may be embedded by using various forms of packages. For example, the system according to the present disclosure may be embedded by using packages, such as package on package (PoP), ball grid arrays (BGAs), chip scale packages (CSPs), plastic leaded chip carrier (PLCC), plastic dual in line package (PDIP), die in waffle pack, die in wafer form, chip on board (COB), ceramic dual in line package (CERDIP), plastic metric quad flat pack (MQFP), thin quad flat pack (TQFP), small outline (SOIC), shrink small outline package (SSOP), thin small outline (TSOP), thin quad flat pack (TQFP), system in package (SIP), multi-chip package (MCP), wafer-level fabricated package (WFP), and wafer-level processed stack package (WSP).

The detailed description of the present disclosure includes the description of particular embodiments, however, we note that various modifications may be made without departing from the scope and the technical spirit of the present disclosure. Therefore, the scope of the present disclosure is not limited to the described embodiments, but shall be defined by the following claims and equivalents thereof.

What is claimed is:

1. A memory device, comprising:
a memory block including a plurality of cell strings;
a peripheral circuit configured to set voltages for a program operation of selected memory cells in the cell strings, and program the selected memory cells by using the set voltages; and
a control circuit configured to control the peripheral circuit for programming the selected memory cells in response to a program command, and to increase a channel voltage of non-selected cell strings including non-selected memory cells while the selected memory cells are programmed.

2. The memory device of claim 1, wherein the control circuit controls the peripheral circuit for increasing the channel voltage according to at least one of a target voltage of the selected memory cells, a verify voltage used in the program operation, and a program time taken for the program operation.

3. The memory device of claim 2, wherein the control circuit controls the peripheral circuit for increasing the channel voltage stepwise according to an increase in the at least one of the target voltage, the verify voltage, and the program time.

4. The memory device of claim 2, wherein when the channel voltage is increased according to the target voltage, the control circuit compares a pre-set target voltage with a target voltage, which is set to be higher than the pre-set target voltage, and maintains the channel voltage with a precharge voltage when the target voltage is lower than the pre-set target voltage, and increases the precharge voltage when the target voltage is equal to or higher than the pre-set target voltage.

5. The memory device of claim 2, wherein when the channel voltage is increased according to the verify voltage, the control circuit compares a pre-set verify voltage with a verify voltage, which is set to be higher than the pre-set verify voltage, and maintains the channel voltage with a precharge voltage when the verify voltage is lower than the pre-set verify voltage, increases the precharge voltage when the verify voltage is equal to or higher than the pre-set verify voltage.

6. The memory device of claim 2, wherein when the channel voltage is increased according to the program time, the control circuit compares a pre-set program time with a program time, which is set to be longer than the pre-set program time, and maintains the channel voltage with a precharge voltage when the program time is shorter than the pre-set program time, and increases the precharge voltage when the program time is equal to or longer than the pre-set program time.

7. The memory device of claim 1, wherein the cell strings include source select transistors, memory cells, and drain select transistors connected between a source line and bit lines.

8. The memory device of claim 7, wherein when the channel voltage is increased through a voltage applied to the source line, the peripheral circuit increases a source line voltage applied to the source line.

9. The memory device of claim 7, wherein when the channel voltage is increased through a voltage applied to the source line, the peripheral circuit increases a source select line voltage for turning on the source select transistors.

10. The memory device of claim 7, wherein when the channel voltage is increased through a voltage applied to the bit lines, the peripheral circuit increases a drain select line voltage for turning on the drain select transistors.

\* \* \* \* \*